(12) United States Patent
Cesaretti et al.

(10) Patent No.: US 10,520,559 B2
(45) Date of Patent: Dec. 31, 2019

(54) ARRANGEMENTS FOR HALL EFFECT ELEMENTS AND VERTICAL EPI RESISTORS UPON A SUBSTRATE

(71) Applicant: Allegro MicroSystems, LLC, Manchester, NH (US)

(72) Inventors: Juan Manuel Cesaretti, Ciudad de Buenos Aires (AR); Andreas P. Friedrich, Metz-Tessy (FR); Gerardo A. Monreal, Buenos Aires (AR); Alejandro Gabriel Milesi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 127 days.

(21) Appl. No.: 15/676,148

(22) Filed: Aug. 14, 2017

(65) Prior Publication Data

US 2019/0049529 A1   Feb. 14, 2019

(51) Int. Cl.
*G01R 33/07* (2006.01)
*G01R 33/00* (2006.01)
*H01L 43/14* (2006.01)

(52) U.S. Cl.
CPC ....... *G01R 33/077* (2013.01); *G01R 33/0029* (2013.01); *G01R 33/0082* (2013.01); *G01R 33/075* (2013.01); *H01L 43/14* (2013.01)

(58) Field of Classification Search
CPC ..... G01R 33/07; G01R 33/075; G01R 33/077
See application file for complete search history.

(56) References Cited

U.S. PATENT DOCUMENTS

| | | |
|---|---|---|
| 4,236,832 A | 12/1980 | Komatsu et al. |
| 4,345,477 A | 8/1982 | Johnson |
| 4,430,895 A | 2/1984 | Colton |
| 4,438,347 A | 3/1984 | Gehring |
| 4,703,663 A | 11/1987 | Oppermann |
| 4,752,733 A | 6/1988 | Petr et al. |
| 4,758,943 A | 7/1988 | Aström et al. |
| 4,760,285 A | 7/1988 | Nelson |
| 4,823,075 A | 4/1989 | Alley |
| 4,833,406 A | 5/1989 | Foster |
| 4,965,762 A | 10/1990 | Williams |
| 4,970,411 A | 11/1990 | Halg et al. |
| 4,987,781 A | 1/1991 | Reimann |

(Continued)

FOREIGN PATENT DOCUMENTS

| | | |
|---|---|---|
| CN | 1501093 | 6/2004 |
| CN | 101023367 | 8/2007 |

(Continued)

OTHER PUBLICATIONS

Response to Office Action filed on Nov. 1, 2016 for U.S. Appl. No. 14/681,575; 12 pages.

(Continued)

*Primary Examiner* — Walter L Lindsay, Jr.
*Assistant Examiner* — Milton Gonzalez
(74) *Attorney, Agent, or Firm* — Daly, Crowley, Mofford & Durkee, LLP

(57) ABSTRACT

Hall effect elements are driven by current generators that use vertical epi resistors disposed away from an edge of a substrate upon which, within which, or over which, the Hall effect elements, the current generators, and the vertical epi resistors are disposed.

21 Claims, 16 Drawing Sheets

(56) References Cited

U.S. PATENT DOCUMENTS

| | | |
|---|---|---|
| 5,135,062 A | 8/1992 | Lockery et al. |
| 5,247,278 A | 9/1993 | Pant et al. |
| 5,285,155 A | 2/1994 | Ueda et al. |
| 5,329,416 A | 7/1994 | Ushiyama et al. |
| 5,343,143 A | 8/1994 | Voisine et al. |
| 5,412,255 A | 5/1995 | Wallrafen |
| 5,424,558 A | 6/1995 | Borden et al. |
| 5,469,058 A | 11/1995 | Dunnam |
| 5,521,501 A | 5/1996 | Dettmann et al. |
| 5,572,058 A * | 11/1996 | Biard .................. G01R 33/077 257/421 |
| 5,614,754 A | 3/1997 | Inoue |
| 5,621,319 A | 4/1997 | Bilotti et al. |
| 5,640,090 A | 6/1997 | Furuya et al. |
| 5,652,445 A | 7/1997 | Johnson |
| 5,679,973 A * | 10/1997 | Mochizuki ............ H01L 43/06 257/421 |
| 5,734,703 A | 3/1998 | Hiyoshi |
| 5,844,140 A | 12/1998 | Seale |
| 6,011,770 A | 1/2000 | Tan |
| 6,023,978 A | 2/2000 | Dauenhauer et al. |
| 6,104,231 A * | 8/2000 | Kirkpatrick, II ........ G01R 33/07 327/378 |
| 6,351,506 B1 | 2/2002 | Lewicki |
| 6,362,618 B1 | 3/2002 | Motz |
| 6,392,478 B1 | 5/2002 | Mulder et al. |
| 6,436,748 B1 | 8/2002 | Forbes et al. |
| 6,437,558 B2 | 8/2002 | Li et al. |
| 6,441,460 B1 | 8/2002 | Viebach |
| 6,639,290 B1 | 10/2003 | Hohe et al. |
| 6,750,644 B1 | 6/2004 | Berkcan |
| 6,853,178 B2 | 2/2005 | Hayat-Dawoodi |
| 6,896,407 B2 | 5/2005 | Nomiyama et al. |
| 6,917,321 B1 | 7/2005 | Haurie et al. |
| 6,973,836 B2 | 12/2005 | Katsumata et al. |
| 6,991,367 B2 | 1/2006 | Adlerstein |
| 7,038,448 B2 | 5/2006 | Schott et al. |
| 7,190,784 B2 | 3/2007 | Li |
| 7,205,622 B2 * | 4/2007 | Alimi .................. G01R 33/077 257/422 |
| 7,253,490 B2 * | 8/2007 | Oohira .................. G01R 33/07 257/424 |
| 7,259,545 B2 | 8/2007 | Stauth et al. |
| 7,292,095 B2 | 11/2007 | Burt et al. |
| 7,319,319 B2 | 1/2008 | Jones et al. |
| 7,323,870 B2 | 1/2008 | Tatschl et al. |
| 7,325,175 B2 | 1/2008 | Momtaz |
| 7,339,245 B2 | 3/2008 | Mueller |
| 7,345,470 B2 | 3/2008 | Suzuki |
| 7,425,821 B2 | 9/2008 | Monreal et al. |
| 7,474,093 B2 | 1/2009 | Ausserlechner |
| 7,511,484 B2 * | 3/2009 | Oohira .................. G01R 33/07 324/251 |
| 7,518,354 B2 | 4/2009 | Stauth et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,769,110 B2 | 8/2010 | Momtaz |
| 7,782,050 B2 * | 8/2010 | Ausserlechner ........ G01R 33/07 257/427 |
| 7,800,389 B2 | 9/2010 | Friedrich et al. |
| 7,872,322 B2 | 1/2011 | Schott et al. |
| 7,923,996 B2 | 4/2011 | Doogue |
| 7,936,029 B2 | 5/2011 | Wang |
| 7,936,144 B2 | 5/2011 | Vig et al. |
| 7,961,823 B2 | 6/2011 | Kolze et al. |
| 7,980,138 B2 | 7/2011 | Ausserlechner |
| 7,990,209 B2 | 8/2011 | Romero |
| 8,030,918 B2 | 10/2011 | Doogue et al. |
| 8,128,549 B2 | 3/2012 | Testani et al. |
| 8,134,358 B2 | 3/2012 | Charlier et al. |
| 8,203,102 B2 | 6/2012 | Nakano et al. |
| 8,203,329 B2 | 6/2012 | Hohe et al. |
| 8,215,177 B2 | 7/2012 | Hayner et al. |
| 8,357,983 B1 | 1/2013 | Wang |
| 8,447,556 B2 | 5/2013 | Friedrich et al. |
| 8,616,065 B2 | 12/2013 | Stewart et al. |
| 8,618,821 B2 | 12/2013 | Fornara et al. |
| 8,680,846 B2 | 3/2014 | Cesaretti et al. |
| 8,692,546 B2 | 4/2014 | Cesaretti et al. |
| 8,723,515 B2 | 5/2014 | Motz et al. |
| 8,818,749 B2 | 8/2014 | Friedrich et al. |
| 9,003,897 B2 | 4/2015 | Wade et al. |
| 9,016,135 B2 * | 4/2015 | Huber .................. G01D 3/0365 257/414 |
| 9,121,896 B2 | 9/2015 | Fornara et al. |
| 9,312,473 B2 | 4/2016 | Kosier et al. |
| 9,322,840 B2 | 4/2016 | Ausserlechner |
| 9,638,764 B2 | 5/2017 | Cesaretti et al. |
| 9,753,097 B2 | 9/2017 | Romero |
| 9,766,300 B2 | 9/2017 | Motz et al. |
| 9,846,204 B2 * | 12/2017 | Huber ................ G01R 33/0064 |
| 9,851,417 B2 | 12/2017 | Kosier et al. |
| 9,857,437 B2 | 1/2018 | Taylor et al. |
| 9,929,141 B2 | 3/2018 | Kuo et al. |
| 10,107,873 B2 | 10/2018 | Cesaretti |
| 10,162,017 B2 | 12/2018 | Cesaretti |
| 2002/0084923 A1 | 7/2002 | Li |
| 2002/0093332 A1 * | 7/2002 | Schroeder .............. G01R 33/07 324/251 |
| 2002/0100948 A1 | 8/2002 | Yoshihara et al. |
| 2003/0038675 A1 | 2/2003 | Gailus et al. |
| 2003/0102909 A1 | 6/2003 | Motz |
| 2004/0032246 A1 | 2/2004 | Motz |
| 2005/0265898 A1 | 12/2005 | Bell et al. |
| 2006/0097715 A1 * | 5/2006 | Oohira .................. G01R 33/066 324/207.2 |
| 2006/0202692 A1 | 9/2006 | Tatschl et al. |
| 2007/0018655 A1 | 1/2007 | Ausserlechner et al. |
| 2007/0110199 A1 | 5/2007 | Momtaz et al. |
| 2007/0247141 A1 | 10/2007 | Pastre et al. |
| 2007/0263700 A1 | 11/2007 | Moelkner et al. |
| 2007/0265898 A1 | 11/2007 | Naono et al. |
| 2007/0285089 A1 | 12/2007 | Ibuki et al. |
| 2008/0094055 A1 | 4/2008 | Monreal et al. |
| 2008/0110987 A1 | 5/2008 | Cato et al. |
| 2008/0137784 A1 | 6/2008 | Krone |
| 2008/0238410 A1 | 10/2008 | Charlier et al. |
| 2008/0265880 A1 | 10/2008 | Nishikawa |
| 2009/0001964 A1 | 1/2009 | Strzalkowski |
| 2009/0001972 A1 | 1/2009 | Fernandez et al. |
| 2009/0029668 A1 | 1/2009 | Hsieh et al. |
| 2009/0085706 A1 | 4/2009 | Baarman et al. |
| 2009/0108839 A1 | 4/2009 | Ausserlechner |
| 2009/0212765 A1 | 8/2009 | Doogue et al. |
| 2010/0045362 A1 | 2/2010 | Dribinsky et al. |
| 2010/0117638 A1 | 5/2010 | Yamashita et al. |
| 2010/0117715 A1 | 5/2010 | Ariyama |
| 2010/0211347 A1 | 8/2010 | Friedrich et al. |
| 2010/0315108 A1 | 12/2010 | Fornara et al. |
| 2011/0018533 A1 | 1/2011 | Cesaretti et al. |
| 2011/0048102 A1 | 3/2011 | Fernandez et al. |
| 2011/0080933 A1 | 4/2011 | Rivero |
| 2011/0298448 A1 | 12/2011 | Foletto et al. |
| 2011/0298453 A1 | 12/2011 | Kura et al. |
| 2012/0016614 A1 | 1/2012 | Hohe et al. |
| 2012/0112695 A1 | 5/2012 | Nishi et al. |
| 2012/0313635 A1 | 12/2012 | Daubert |
| 2013/0057084 A1 | 3/2013 | Lee |
| 2013/0093412 A1 | 4/2013 | Anelli et al. |
| 2014/0009221 A1 | 1/2014 | Motz et al. |
| 2015/0115937 A1 | 4/2015 | Fujita et al. |
| 2016/0241186 A1 | 8/2016 | Motz |
| 2017/0261306 A1 | 9/2017 | Ausserlechner |

(56) References Cited

U.S. PATENT DOCUMENTS

| | | | |
|---|---|---|---|
| 2017/0331429 | A1 | 11/2017 | Motz |
| 2018/0026609 | A1 | 1/2018 | Scilla |

FOREIGN PATENT DOCUMENTS

| | | |
|---|---|---|
| CN | 200986484 | 12/2007 |
| DE | 195 39 458 | 4/1997 |
| DE | 196 06 826 | 8/1997 |
| DE | 10 2005 047 413 | 9/2006 |
| DE | 10 2006 037 226 | 2/2008 |
| DE | 10 2007 041 230 | 4/2009 |
| EP | 0 289 414 | 11/1988 |
| EP | 0 338 122 | 10/1989 |
| EP | 0 357 013 | 3/1990 |
| EP | 1 637 898 | 3/2006 |
| EP | 1 679 524 | 7/2006 |
| EP | 1 850 143 | 10/2007 |
| EP | 2 339 735 | 6/2011 |
| GB | 2 276 727 | 10/1994 |
| JP | S 6148777 | 3/1986 |
| JP | H03-248611 | 11/1991 |
| JP | 2000-055999 | 2/2000 |
| JP | 2002-213992 | 7/2002 |
| JP | 2004-177228 | 6/2004 |
| JP | 2004-234589 | 8/2004 |
| JP | 2006-126012 | 5/2006 |
| JP | 2008-513762 | 5/2008 |
| JP | 2010-500536 | 1/2010 |
| JP | 4840481 | 1/2011 |
| JP | 2011-052036 | 3/2011 |
| KR | 10-2007-0060096 | 6/2007 |
| TW | 200640135 | 11/2006 |
| WO | WO 96/02849 | 2/1996 |
| WO | WO 2004/072672 | 8/2004 |
| WO | WO 2006/035342 | 4/2006 |
| WO | WO 2006/056829 | 6/2006 |
| WO | WO 2007/138508 | 12/2007 |
| WO | WO 2008/048379 | 4/2008 |
| WO | WO 2008/123144 | 10/2008 |
| WO | WO 2010/096367 | 8/2010 |
| WO | WO 2011/011479 | 1/2011 |
| WO | WO 2012/013977 | 2/2012 |

OTHER PUBLICATIONS

Office Action dated Aug. 12, 2016 for U.S. Appl. No. 14/681,575; 27 pages.
Official Communication reply dated May 9, 2018 for EP Pat. Appl. No. 16716398.9; 3 pages.
Amended to Specification filed May 9, 2018 for EP Pat. Appl. No. 16716398.9; 2 pages.
Amended to Claims filed May 9, 2018 for EP Pat. Appl. No. 16716398,9; 5 pages.
Communication under Rule 71(3) EPC dated Feb. 22, 2019 for European Application No. 17180353.9; 7 Pages.
Partial European Search Report dated Dec. 19, 2017 from Application No. 17180353.9; 19 Pages.
Notice of Allowance dated Jun. 20, 2018 for U.S. Appl. No. 15/207,903; 13 pages.
U.S. Preliminary Amendment filed on Jan. 3, 2019 for U.S. Appl. No. 16/132,653; 10 Pages.
Notice of Allowance dated Jul. 16, 2018 for U.S. Appl. No. 15/066,331; 13 Pages.
Response to Written Opinion for European Application No. 17180353.9 as filed on Dec. 13, 2018; 17 Pages.
U.S. Appl. No. 16/132,653, filed Sep. 17, 2018, Cesaretti.
PCT International Preliminary Report on Patentability dated Sep. 20, 2018, for Application No. PCT/US2017/020066; 8 Pages.
U.S. Non-Final Office Action dated Apr. 3, 2018 for U.S. Appl. No. 15/207,903; 21 Pages.
U.S. Notice of Allowance dated Feb. 11, 2019 for U.S. Appl. No. 16/132,653; 9 Pages.
Response to U.S. Non-Final Office Action dated Apr. 3, 2018 for U.S. Appl. No. 15/207,903; Response filed on Apr. 12, 2018; 11 Pages.
U.S. Non-Final Office Action dated Apr. 27, 2018 for U.S. Appl. No. 15/066,331; 11 Pages.
Search Report and Written Opinion dated May 11, 2018 for European Application No. 17180353.9, 23 pages.
Communication under Rule 71(3) EPC dated Sep. 14, 2018 for European Application No. 16716398.9; 7 Pages.
Allowed Specification dated Sep. 14, 2018 for European Application No. 16716398.9; 33 Pages.
U.S. Appl. No. 15/207,903, filed Jul. 12, 2016, Cesaretti.
U.S. Appl. No. 15/066,331, filed Mar. 10, 2016, Cesaretti.
Ackermann at al; "New Generation of Hall-effect Based Current Sensor: Evolution from Core-based to Integrated;" M. Sc. Laurent Coulot, Melexis Technologies, A.G.Bevaix; Apr. 1, 2015; 8 pages.
Allegro MicroSystems, LLC; A3981 Automotive, Programmable Stepper Driver; datasheet; Jan. 2013; 43 pages.
Ausserlechner et al; "Compensation of the Piezo-Hall Effect in integrated Hall Sensors on (100)-Si;" IEEE Sensors Journal, vol. 7, No. 11; Nov. 2007; ISBN: 1530-437X; 8 pages.
Ausserlechner et al; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0/7803-8692-2; 4 pages.
Ausserlechner; "Limits of Offset Cancellation by the Principle of Spinning Current Hall Probe;" Proceedings of IEEE Sensors; Oct. 2004; 4 pages.
Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 pages.
Bahreyni, at al.; "A Resonant Micromachined Magnetic Field Sensor;" IEEE Sensors Journal; vol. 7, No. 9, Sep. 2007; 9 pages.
Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 pages.
Baschirotto et al.; "Development and Analysis of PCB Vector 2-D Magnetic Field Sensor System for Electronic Compass;" IEEE Sensors Journal vol. 6, No. 2; Apr. 2006; 7 pages.
Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 pages.
Blagoievic et al.; "FD SOI Hall Sensor Electronics Interfaces for Energy Measurement;" Microelectronics Journal 37; Sep. 2006; 8 pages.
Cesaretti et al.; "Effect of Stress Due to Plastic Package Moisture Absorption in Hall Sensors;" IEEE Transactions on Magnets; vol. 45; No. 10; Oct. 2009; 4 pages.
Demierre, et al.; "Reference Magnetic Actuator for Self-Calibration of a Very Small Hall Sensor Array;" Sensors and Actuators A97-98; Apr. 2002; 8 pages.
Frick, et al.; "CMOS Microsystem for AC Current Measurement with Galvanic Isolation;" IEEE Sensors Journal; vol. 3, No. 6; Dec. 2003; 9 pages.
Halg; "Piezo-Hall Coefficients of n-Type Silicon;" Journal of Applied Physics; vol. 64, No. 1; Jul. 1, 1988; 7 pages.
Hosticka; "CMOS Sensor Systems;" Sensors and Actuators A66; Apr. 1998; 7 pages.
Huber et al.; "Package Stress Monitor to Compensate for the Piezo-Hall Effect in CMOS Hall Sensors;" IEEE Sensors Journal, vol. 13, No. 8; Aug. 2013; 9 pages.
Kammerer at; "A Hall Effect Sensors Network Insensitive to Mechanical Stress;" Proceedings of IEEE Sensors; Oct. 2004; 4 pages.
Kanda et al.; "The Piezo-Hall Effect in n-Silicon;" $22^{nd}$ International Conference on the Physics of Semiconductors; vol. 1, Jan. 1995; 4 pages.
Kanda; "A Graphical Representation of the Piezoresistance Coefficients in Silocon;" IEEE Transactions of Electron Devices; vol. Ed-29, vol. 1; Jan. 1982; 7 pages.
Kayal et al.; "Automatic Calibration of Hall Sensor Microsystems;" Microelectronics Journal 37; Sep. 2006; 7 pages.

(56) References Cited

OTHER PUBLICATIONS

Mangnani et al.; "Mechanical Stress Measurement Electronics Based on Piezo-Resistive and Piezo-Hall Effects;" 9th International Conference on Electronics, Circuits and Systems 2002; vol. 1; SBN: 0-7803-7596-3; Dec. 2002; 4 pages.
Manic et al.; "Short and Long-Term Stability Problems of Hall Plates in Plastic Packages;" IEEE 38th Annual International Reliability Physics Symposium; Apr. 2000; 4 pages.
Manic; "Drift in Silicon integrated Sensors and Circuits Due to the Thermo-Mechanical Stresses;" Lausanne, École Polytechnique Fédérale De Lausanne 2000; 176 pages.
Molz et al.; "A Miniature Digital Current Sensor with Differential Hall Probes Using Enhanced Chopping Techniques and Mechanical Stress Compensation;" IEEE Sensors; Oct. 2012; 4 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; 7 pages.
Motz, et al.; "A Chopped Hall Sensor with Small Jitter and Programmable "True Power-On" Function;" IEEE Journal of Solid-State Circuits; vol. 40, No. 7; Jul. 2005; 8 pages.
Motz, et al.; "An Integrated Hall Sensor Platform Design for Position, Angle and Current Sensing;" IEEE Sensors 2006; Exco, Daegu, Korea / Oct. 2006; 4 pages.
Munter; "A Low-offset Spinning-current Hall Plate;" Sensors and Actuators A21-A23; 1990; 4 pages.
Munter; "Electronic Circuitry for a Smart Spinning-current Hall Plate with Low Offset;" Sensors and Actuators A; Jun. 1991; 5 pages.
Partin et al.; "Temperature Stable Hall Effect Sensors;" IEEE Sensors Journal, vol. 6, No. 1; Feb. 2006; 5 pages.
Pastre, et al.; "A Hall Sensor Analog Front End for Current Measurement with Continuous Gain Calibration;" IEEE Sensors Journal; vol. 7, No. 5; May 2007; 8 pages.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; 4 pages.
Popovic; "Sensor Microsystems;" Proc. 20th International Conference on Microelectronics (MWIL 95); vol. 2, NIS, Serbia, Sep. 12-14, 1995; 7 pages.
Randhawa; "Monolithic Integrated Hall Devices in Silicon Circuits;" Microelectronics Journal; vol. 12, No. 6; Sep. 14-17, 1981; 6 pages.
Randjelovic et al.; "Highly Sensitive Hall Magnetic Sensor Microsystems in CMOS Technology;" IEEE Journal of Solid-State Circuits, vol. 37, No. 2; Feb. 2002; 9 pages.
Ruther et al.; "Integrated CMOS-Based Sensor Array for Mechanical Stress Mapping;" 5th IEEE Conference on Sensors, Oct. 2007; 4 pages.
Ruther et al.; "Thermomagnetic Residual Offset in Integrated Hall Plates;" IEEE Sensors Journal; vol. 3, No. 6; Dec. 2003; 7 pages.
Sargent; "Switched-capacitor IC controls feedback loop;" EDN; Design Ideas; Feb. 17, 2000; 2 pages.
Schneider, et al.; "Temperature Calibration of CMOS Magnetic Vector Probe for Contactless Angle Measurement System;" IEDM; Dec. 1996; 4 pages.
Schott et al.; "Linearizing Integrated Hall Devices;" 1997 International Conference on Solid-State Sensors and Actuators, Jun. 16-19, 1997; 4 pages.
Schott, et al.; "CMOS Single-Chip Electronic Compass with Microcontroller;" IEEE Journal of Solid-State Circuits; vol. 42, No. 12; Dec. 2007; 11 pages.
Schweda et al.; "A Nonlinear Simulation Model for Integrated Hall Devices in CMOS Silicon Technology;" Proceedings of 2002 IEEE International Behavioral Modeling and Simulation, BMAS 2002; Oct. 6-8, 2002; 7 pages.
Simon et al.; "Autocalibration of Silicon Hall Devices;" 8th International Conference on Solid-State Sensors and Actuators; vol. 2; Jun. 25, 1995; 4 pages.
Steiner et al; Offset Reduction in Hall Devices by Continuous Spinning Current Method; Sensors and Actuators A66; 1998; 6 pages.
Steiner: "Double-Hall Sensor with Self-Compensated Offset," Electron Devices Meeting; IDSM '97 Technical Digest; Dec. 7-10, 1997; 4 pages.
Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 pages.
Tian et al.; "Multiple Sensors on Pulsed Eddy-Current Detection for 3-D Subsurface Crack Assessment;" IEEE Sensors Journal, vol. 5, No. 1; Feb. 2005; 7 pages.
Trontelj et al; "CMOS Integrated Magnetic Field Source Used as a Reference in Magnetic Field Sensors on Common Substrate;" WEP 1-6; IMTC; May 1994; 3 pages.
Van der Meer et al; "CMOS Quad-Spinning-Current Hall-Sensor System for Compass Application;" Proceedings of IEEE Sensors, vol. 3; Oct. 2004; 4 pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 pages.
Zou et al.; "Three-Dimensional Die Surface Stress Measurements in Delaminated and Non-Delaminated Plastic Packages;" 48th Electronic Components and Technology Conference; May 25, 1998; 12 pages.
PCT International Search Report and Written Opinion dated Jul. 20, 2016 for International Application No. PCT/US2016/025495; 20 pages.
Response to U.S. Non-Final Office Action dated Apr. 27, 2018 for U.S. Appl. No. 15/066,331; Response filed Jun. 8, 2018; 10 Pages.
Huber et al., "Package Stress Monitor to Compensate for the Piezo-Hall Effect in CMOS Hall Sensors"; 978-1-4577-1767-3/12, May 2012, ©2012 IEEE; 4 pages.
Huber et al., "A Fully Integrated Analog Compensation for the Piezo-Hall Effect in a CMOS Single-Chip Hall Sensor Microsystem;"; IEEE Sensors Journal, vol. 15, No. 5, May 2015; 10 pages.
Office Action dated Sep. 10, 2019 for German Application No. 112009000448.2 with English Translation; 23 Pages.

\* cited by examiner

ARRANGEMENTS FOR HALL EFFECT ELEMENTS AND VERTICAL EPI RESISTORS UPON A SUBSTRATE

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to a magnetic field sensor having an electronic circuit for driving Hall effect elements with drive currents compensated for a stress in a substrate upon which the Hall effect elements are disposed.

BACKGROUND

Hall effect elements are known. A typical planar or horizontal Hall effect element is a four terminal device for which a drive current (a DC current) is passed between two opposing ones of the four terminals and a differential voltage (AC or DC), responsive to a magnetic field (AC or DC), is generated between the other two opposing ones of the four terminals. An amplitude of the differential output signal (i.e., voltage) is related an amplitude of the drive current. Thus, a sensitivity (e.g., mV per Gauss) of the differential output signal is related to the amplitude of the drive current.

The Hall effect element can be used in current spinning or chopping arrangements in order to reduce a DC offset from the Hall effect element, which is typified by a non-zero output voltage from the Hall effect element even when experiencing a zero magnetic field. With current spinning or chopping, the terminals used to pass the drive current and the terminals used to generate the differential output signal can be changed at a current spinning rate in a periodic and cyclic manner. There can be two such changes per cycle with two-phase current spinning or four such changes with four-phase current spinning.

In order to maintain a constant and stable sensitivity, the drive current can be generated with a stable current source or a current sink that uses a stable reference voltage. However, various parameters can cause the sensitivity to magnetic fields of the differential output signal to change.

In general, even with a perfectly stable drive current, the Hall effect element itself can experience sensitivity changes. The changes in sensitivity of the Hall effect element can result directly from temperature changes. In order to correct for this sensitivity change, temperature can be sensed and the changes in sensitivity with temperature can be corrected.

However, the changes in sensitivity of the differential output signal can also result from stresses upon a substrate on which the Hall effect element is disposed. The stresses may or may not be related to temperature and also may or may not be related to a thermal coefficient of a material of a package used to seal the substrate. The stresses and resulting changes in sensitivity may vary from unit to unit in different ways with respect to temperature.

It would be desirable to provide an electronic circuit that can compensate for and correct changes in the sensitivity of a differential output signal generated by a Hall effect element that can result from stresses.

SUMMARY

The present invention provides an electronic circuit that can compensate for and correct changes in the sensitivity of a differential output signal generated by a Hall effect element that can result from stresses.

In accordance with an example useful for understanding an aspect of the present invention, an electronic circuit can include one or more of the following elements. An electronic circuit can include a semiconductor substrate having a surface, the surface of the semiconductor substrate having a width dimension. The electronic circuit can further include an epitaxial layer disposed over the surface of the semiconductor substrate, the epitaxial layer having a first surface distal from the semiconductor substrate and a second surface proximate to the semiconductor substrate. The electronic circuit can further include a first Hall effect element disposed in the epitaxial layer, wherein the first Hall effect element has a geometric center in a plane of the surface of the substrate. The electronic circuit can further include a second Hall effect element disposed in the epitaxial layer, wherein the second Hall effect element has a geometric center in the plane of the surface of the substrate. A line between the geometric centers of the first and second Hall effect element can be parallel to the width dimension of the substrate. The geometric center of the first Hall effect element can have a first Hall effect element distance proximate to a first end of the width dimension and the geometric center of the second Hall effect element can have a second Hall effect element distance proximate to a second end of the width dimension. The electronic circuit can further include a first current generator configured to generate a first drive current that passes through the first Hall effect element. The first current generator can include a first vertical epi resistor disposed in the epitaxial layer and proximate to the first Hall effect element, wherein the first vertical epi resistor has a geometric center, and wherein the geometric center of the first vertical epi resistor has a first vertical epi resistor distance to a first end of the width dimension greater than or equal to the first Hall effect element distance. The electronic circuit can further include a second current generator configured to generate a second drive current that passes through the second Hall effect element. The second current generator can include a second vertical epi resistor disposed in the epitaxial layer and proximate to the second Hall effect element, wherein the second vertical epi resistor has a geometric center, and wherein the geometric center of the second vertical epi resistor has a second vertical epi resistor distance to a second end of the width dimension greater than or equal to the second Hall effect element distance.

In accordance with an example useful for understanding another aspect of the present invention, a method can include one or more of the following elements. A method of biasing a plurality of Hall effect elements can include generating a first reference current by generating a first voltage reference across a first vertical epi resistor disposed in an epitaxial layer over a semiconductor substrate, the epitaxial layer having a first surface distal from the semiconductor substrate and a second surface proximate to the semiconductor substrate. The method can further include injecting a first drive current into a first Hall effect element, wherein the first Hall effect element is disposed over the semiconductor substrate, wherein the first drive current is related to the first reference current, wherein a resistance of the first vertical epi resistor, the first reference current, and the first drive current change in accordance with changes of a stress in the semiconductor substrate. The method can further include generating a second reference current by generating a second voltage reference across a second vertical epi resistor disposed in an epitaxial layer over a semiconductor substrate, the epitaxial layer having a second surface distal from the semiconductor substrate and a second surface proximate to the semiconductor substrate. The method can further include injecting a second drive current into a second Hall effect element, wherein the second Hall effect element is disposed over the semiconductor substrate, wherein the second drive current is related to the second reference current, wherein a resistance of the second vertical epi resistor, the second reference current, and the second drive current change in accordance with changes of a stress in the semiconductor substrate, wherein the first Hall effect element has a geometric center in a plane of the surface of the substrate, wherein the second Hall effect element has a geometric center in the plane of the surface of the substrate, wherein a line between the geometric centers of the first and second Hall effect element is parallel to the width dimension of the substrate, wherein the geometric center of the first Hall effect element has a first Hall effect element distance proximate to a first end of the width dimension and the geometric center of the second Hall effect element has a second Hall effect element distance proximate to a second end of the width dimension, wherein the first vertical epi resistor has a geometric center, wherein the geometric center of the first vertical epi resistor has a first vertical epi resistor distance to a first end of the width dimension greater than or equal to the first Hall effect element distance, wherein the second vertical epi resistor has a geometric center, wherein the geometric center of the second vertical epi resistor has a second vertical epi resistor distance to a second end of the width dimension greater than or equal to the second Hall effect element distance.

In accordance with an example useful for understanding another aspect of the present invention, an electronic circuit can include one or more of the following elements. An electronic circuit can include means for generating a first reference current by generating a first voltage reference across a first vertical epi resistor disposed in an epitaxial layer over a semiconductor substrate, the epitaxial layer having a first surface distal from the semiconductor substrate and a second surface proximate to the semiconductor substrate. The electronic circuit can further include means for injecting a first drive current into a first Hall effect element, wherein the first Hall effect element is disposed over the semiconductor substrate, wherein the first drive current is related to the first reference current, wherein a resistance of the first vertical epi resistor, the first reference current, and the first drive current change in accordance with changes of a stress in the semiconductor substrate. The electronic circuit can further include means for generating a second reference current by generating a second voltage reference across a second vertical epi resistor disposed in an epitaxial layer over a semiconductor substrate, the epitaxial layer having a second surface distal from the semiconductor substrate and a second surface proximate to the semiconductor substrate. The electronic circuit can further include means for injecting a second drive current into a second Hall effect element, wherein the second Hall effect element is disposed over the semiconductor substrate, wherein the second drive current is related to the second reference current, wherein a resistance of the second vertical epi resistor, the second reference current, and the second drive current change in accordance with changes of a stress in the semiconductor substrate, wherein the first Hall effect element has a geometric center in a plane of the surface of the substrate, wherein the second Hall effect element has a geometric center in the plane of the surface of the substrate, wherein a line between the geometric centers of the first and second Hall effect element is parallel to the width dimension of the substrate, wherein the geometric center of the first Hall effect element has a first Hall effect element distance proximate to a first end of the width dimension and the geometric center of the second Hall effect element has a second Hall effect element distance proximate to a second end of the width dimension, wherein the first vertical epi resistor has a geometric center, wherein the geometric center of the first vertical epi resistor has a first vertical epi resistor distance to a first end of the width dimension greater than or equal to the first Hall effect element distance, wherein the second vertical epi resistor has a geometric center, wherein the geometric center of the second vertical epi resistor has a second vertical epi resistor distance to a second end of the width dimension greater than or equal to the second Hall effect element distance.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
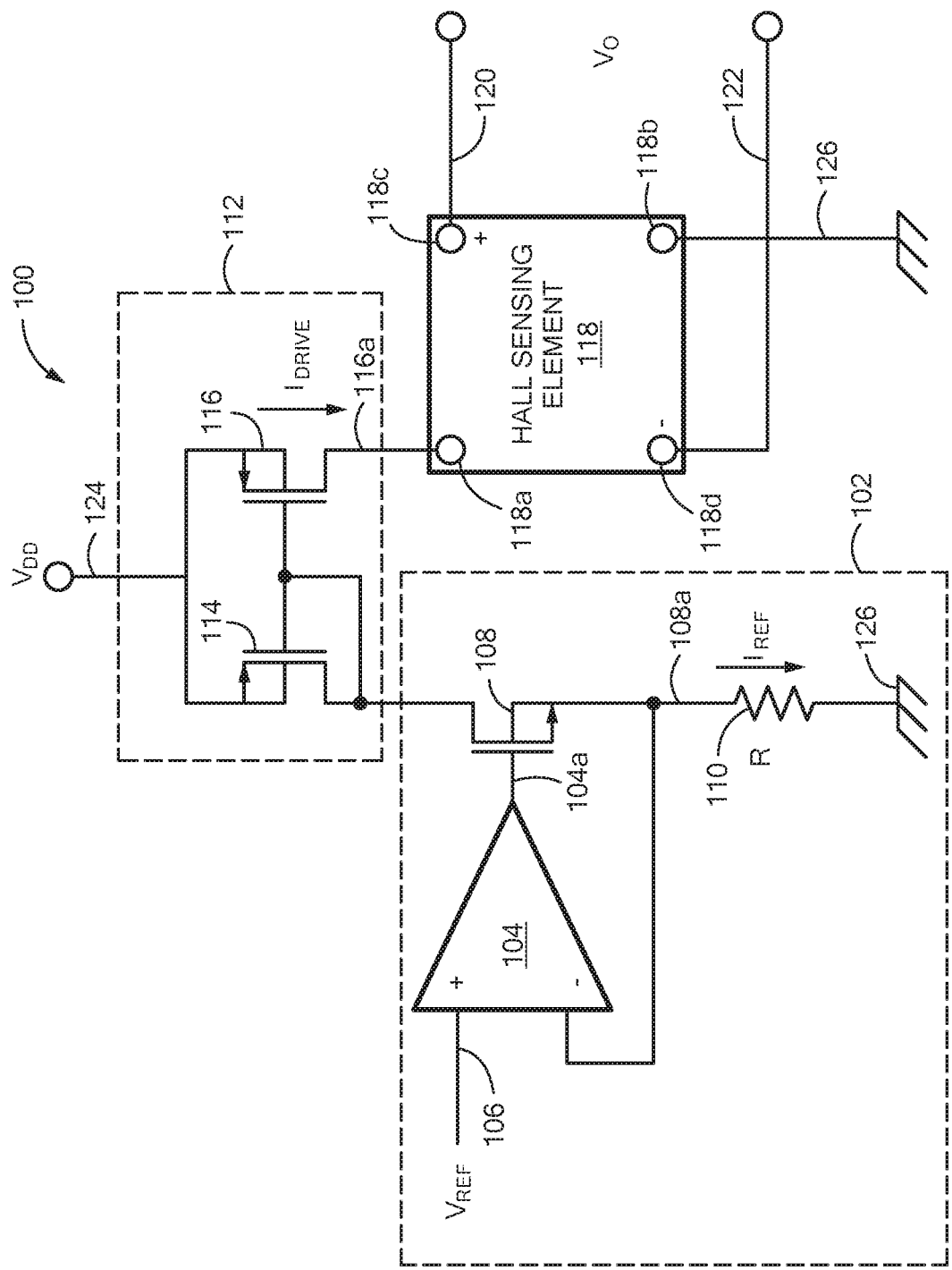
FIG. 1 is a block diagram showing an electronic circuit having a Hall effect element driven with a current generator and a current mirror, the current generator having a resistor that can be of a type shown in FIG. 2.

Before describing the present invention, it should be noted that reference is sometimes made herein to Hell effect elements having a particular shape (e.g., square). One of ordinary skill in the art will appreciate, however, that the techniques described herein are applicable to Hall effect elements having a variety of sizes and shapes.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

As used herein, the term "current generator" is used to describe either a current source or a current sink. It should be understood that a current source has a current output and a current sink has a current input, with a high output or input impedance, respectively.

As used herein, the term "current passing terminal" is used to describe a terminal of an active or passive electronic component that either receives a current or out of which a current comes. Thus, it will be appreciated that both a collector and emitter of a bipolar junction transistor (BJT) are current passing terminals. It will also be appreciated that both a source and a drain of the field effect transistor (FET) are current passing terminals.

As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions)

As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "Light-N" or simply "LN" is used to refer to a region implanted and diffused into a semiconductor layer, for example, into a surface of the epitaxial layer further from the substrate, and having a particular range of concentrations of N-type atoms (i.e. ions).

As used herein, the term "P-well" is used to refer to a region implanted and diffused into a semiconductor layer, for example, into a surface of the epitaxial layer further from the substrate, and having a particular range of concentrations of P-type atoms (i.e. ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after PBL implant and diffusion steps, and the upward diffusion into epi layer can be performed during a field oxidation process.

As used herein, the term "N-type buried layer" or simply "NBL" is used to refer to a region implanted and diffused into a semiconductor layer, for example, implanted into the substrate and then upwardly diffused into the epitaxial (epi) layer. The epi layer can be grown after NBL implant and diffusion steps, and the upward diffusion into epi layer can be performed during a field oxidation process.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures can fall into the following ranges:
substrate=about $1 \times 10^{15}$ P-type atoms per cm$^3$, for example, boron atoms.
epi=about $1 \times 10^{15}$ to about $6 \times 10^{15}$ N-type atoms per cm$^3$, for example, Arsenic atoms,
    where: $5 \times 10^{14}$ to $1 \times 10^{15}$ can be representative of a concentration of epi bulk doping, and $5 \times 10^{15}$ to $1 \times 10^{16}$ can be representative of a concentration at a surface region of the epi layer at about 2 um depth created by an additional epi implant step. (Alternatively, $1 \times 10^{15}$ to $6 \times 10^{15}$).
N+=about $1 \times 10^{20}$ N-type atoms per cm$^3$, for example, phosphorous atoms.
LN=about 1 to $2 \times 10^{17}$ atoms per cm$^3$, for example, phosphorous atoms.
P-well=about $1 \times 10^{16}$ P-type atoms per cm$^3$, for example, boron atoms.
PBL=about $1 \times 10^{18}$ to about $2 \times 10^{18}$ P-type atoms per cm$^3$, for example, boron atoms.
NBL=about $1 \times 10^{19}$ to about $1.5 \times 10^{19}$ N-type atoms per cm$^3$, for example, antimony atoms.
P+=about $3 \times 10^{19}$ to about $5 \times 10^{19}$ P-type atoms per cm$^3$, for example, boron atoms.

In some embodiments, the concentrations are outside of the above ranges or values, but within about +/- twenty percent of the above ranges or values.

In conjunction with FIGS. 1, 2, 4, and 5 below, driving of and stress compensation of single Hall effect elements using a vertical epi resistor is described. In conjunction with FIG. 3, it is contemplated that more than one vertical epi resistor can be used in series or in parallel. In conjunction with FIGS. 7-14, driving of and stress compensation of two or more Hall effect elements using two or more vertical epi resistors is described.

Referring to FIG. 1, an electronic circuit 100 includes a current generator 102 (a current sink) coupled to a current mirror 112, which is coupled to a Hall effect element 118.

The current generator 102 can include an operational amplifier 104. The operational amplifier 104 can be coupled to receive a reference voltage 106 at a noninverting terminal. The operational amplifier can generate a control signal 104a coupled to a transistor, for example, a field effect transistor (FET) 108, here shown to be an N-channel FET.

A source of the FET 108 can be coupled to an inverting terminal of the operational amplifier 104 and also coupled to a first end of a resistor 110. The other end of the resistor can be coupled to a voltage reference, for example, a ground 126. The resistor 110 has particular characteristics and is described more fully below in conjunction with FIGS. 2 and 3.

The current generator is operable to generate a reference current 108a that passes through the resistor 110, and also through the FET 108, i.e., into the drain of the FET 108. The reference current 108a is generated in accordance with a reference voltage (e.g., 108) generated across the resistor 110 due to a feedback arrangement around the operation amplifier 104. While the current generator 102 uses the operation amplifier 104 to achieve the reference voltage (e.g., 108) across the resistor 110 by way of feedback, it should be appreciated that there are other ways to achieve the reference voltage (e.g., 108) across the resistor 110 without using an operational amplifier.

A drain of the FET 108 can be coupled to the current mirror 112, and, in particular, to a drain of a first current mirror FET 114, here shown to be a P-Channel FET. A gate of the first current mirror FET can be coupled to the drain of the first current mirror FET 114 forming a diode structure.

The gate of the first current mirror FET 114 can be coupled to a gate of the second current mirror FET 116. A source of the first current mirror FET 114 can be coupled to a source of the second current mirror FET 116, which can both be coupled to receive the voltage 124. A drain of the second current mirror FET 116 can supply a drive current 116a.

In some embodiments, the drive current 116a has the same current value as the reference current 108a. However, it will be understood that, by scaling relative physical sizes of the first and second current mirror FETs 114, 116, the drive current 116a can be greater than or less than the reference current 108a.

The drive current 116a can be received by a first terminal 118a of the Hall effect element 118. The drive current 116a can pass from the first terminal 118a, through the Hall effect element 118, to a second terminal 118b. A voltage reference, for example, ground 126, can be coupled to receive the drive current 116a.

A differential output signal 120, 122 (a differential voltage) can be generated between the third and fourth terminals 118c, 118d, respectively, of the Hall effect element 118. The differential output signal 120, 122 is related to an amplitude of the drive current 116a, and also related to a magnitude of an external magnetic field.

It should be appreciated that the first terminal 118a has a higher voltage than the second terminal 118b. Thus, the first terminal 118a is referred to herein as a higher voltage terminal and the second terminal 118b is referred to herein as a lower voltage terminal.

As described above, in operation, a sensitivity of the Hall effect element 118 (i.e., sensitivity of the differential output signal 120, 122) is directly related to a value of the drive current 116a. As also described above, the sensitivity of the Hall effect element 118 (i.e., sensitivity of the differential output signal 120, 122) can vary or change directly with temperature. The sensitivity of the Hall effect element 118 can also vary or change in a way related to stresses upon a substrate in which the Hall effect element 118 is disposed, which stresses may or may not be related to temperature.

If the resistor 110 was merely a conventional resistor, there would be no compensation for the variation or change of the sensitivity of the Hall effect element 118 with respect to stresses of the substrate. However, as described more fully below in conjunction with FIGS. 2 and 3, the resistor 110 has a particular construction (i.e., a vertical epi resistor construction) that makes a resistance of the resistor 110 change with stress of the substrate by an amount that generally compensates for changes in the sensitivity of the Hall effect element 118 with regard to stress, essentially by changing the drive current 116a as the stress changes. Changes in resistance of the resistor 110 result in changes in the reference current 108a, which result in changes of the drive current.

Current spinning or chopping is not shown in FIG. 1. However, it should be appreciated that the drive current 116a can pass between different pairs of the Hall effect element terminals, and the output voltage can be generated at other different pairs of the Hall effect element terminals, in a periodic and cyclic fashion to result in a reduction of offset voltage in the differential output signal 120, 122.

Figure 2:
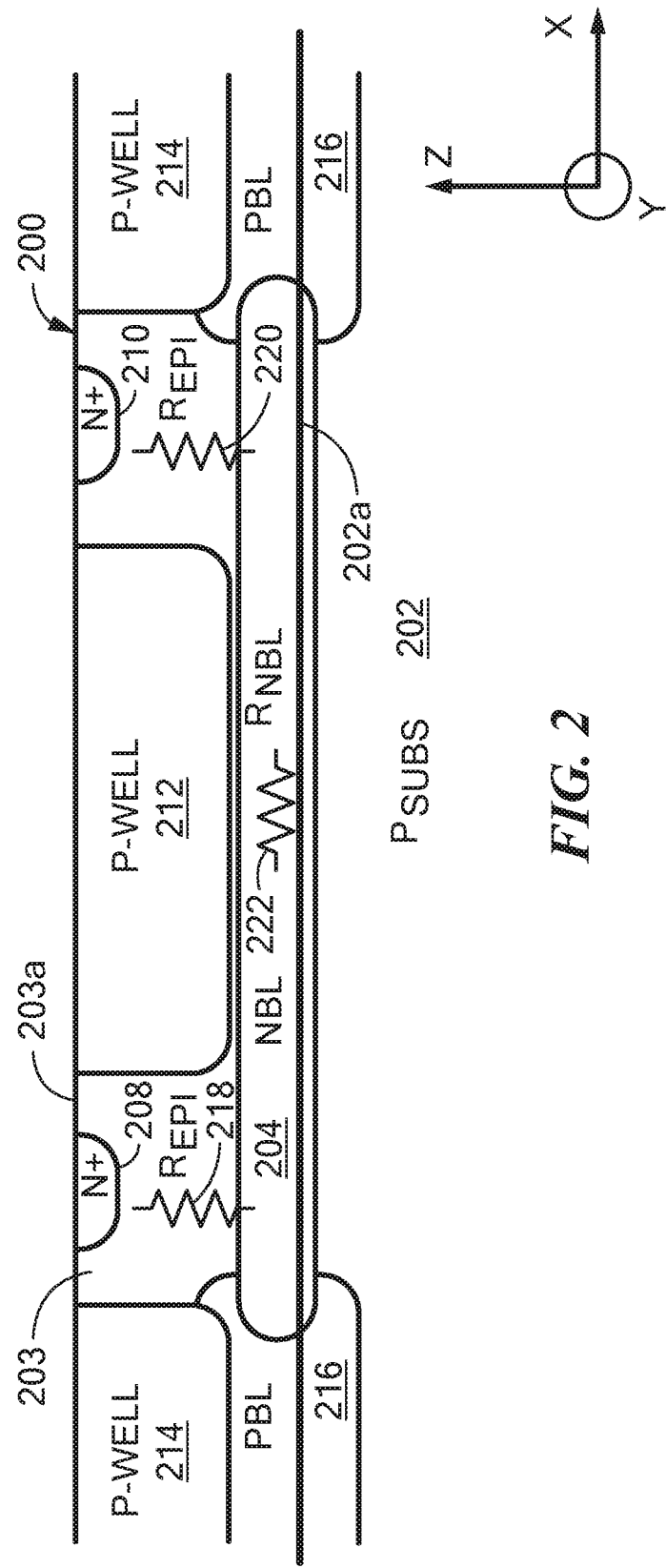
FIG. 2 is a block diagram showing a cross section of an example of a vertical epi resistor that can be used as the resistor of FIG. 1, the vertical epi resistor disposed within an epitaxial layer over a substrate.

Referring now to FIG. 2, a resistor 200 (i.e., a vertical epi resistor) can be the same as or similar to the resistor 110 of FIG. 1. Shown in a side cross-sectional view having a direction indicated by a line 312 of FIG. 3, the resistor 200 can be disposed in an N-type epitaxial layer 203, which is disposed upon P-type semiconductor substrate 202. The substrate 202 has a substrate surface 202a upon which the epitaxial layer 203 is disposed, for example with deposition fabrication techniques.

A PBL region 216 can join with a P-well region 214, forming an electrical barrier to electron flow, the barrier defining a perimeter boundary of the resistor 200.

Techniques for deposition and diffusion of the P-well region 214 and the PBL region 216 will be understood. However, let it suffice here to say that the PBL region 216 can be deposited onto the surface 202a of the substrate 202 before the epitaxial layer 203 is deposited upon the surface 202a of the substrate 202. The P-well region 214 can be deposited upon an outer surface 203a of the epitaxial layer 203, along with another P-well region 212. Heating of the resistor 200 causes the PBL region 216 to diffuse upward into the epitaxial layer 203 and downward into the substrate 202. Heating of the resistor 200 also causes the P-well regions 214, 212 to diffuse downward into the epitaxial layer 203.

An NBL region 204, formed in a way similar to formation of the PBL region 216, can be disposed within the epitaxial layer 203 and under the outer (top) surface 203a of the epitaxial layer 203

Two (or more) N+ pickups 208, 210 can be deposited and diffused into the surface of the epitaxial layer 203. The pickups 208, 210 can be used to form a two-terminal connection to the resistor 200, via metal contacts (not shown), formed in a metal layer (not shown), and that are in electrical communication with the pickups 208, 210.

The NBL region has a nominal resistance 222, which is a low resistance, for example, fifty Ohms.

The epitaxial layer 203 has resistances 218, 220, between the pickups 208, 210 and the NBL region 204. The resistances 218, 220 through the epitaxial layer 203 can have the same nominal resistance value, for example, about one thousand ohms.

The P-well region 212 can result in currents that flow through the resistances 218, 220 being directed substantially vertically to the surface 203a of the epitaxial layer 203.

The resistor 110 of FIG. 1 can be formed by passing the reference current 108a of FIG. 1 between the two pickups 208, 210. It will be understood that a resistance of the resulting resistor 200 is dominated by a series sum of the two resistances 218, 220.

The resistances 218, 220 have a piezo-resistance coefficient of about $53.1 \times 10^{-11}$ per Pascal to stress in the x and y directions, and thus, the resistances 218, 222 change value with stresses upon the substrate 202.

Calculations resulting in benefits of the resistor 200 having the above-described piezoelectric coefficient are described below in conjunction with FIG. 3.

Figure 3:
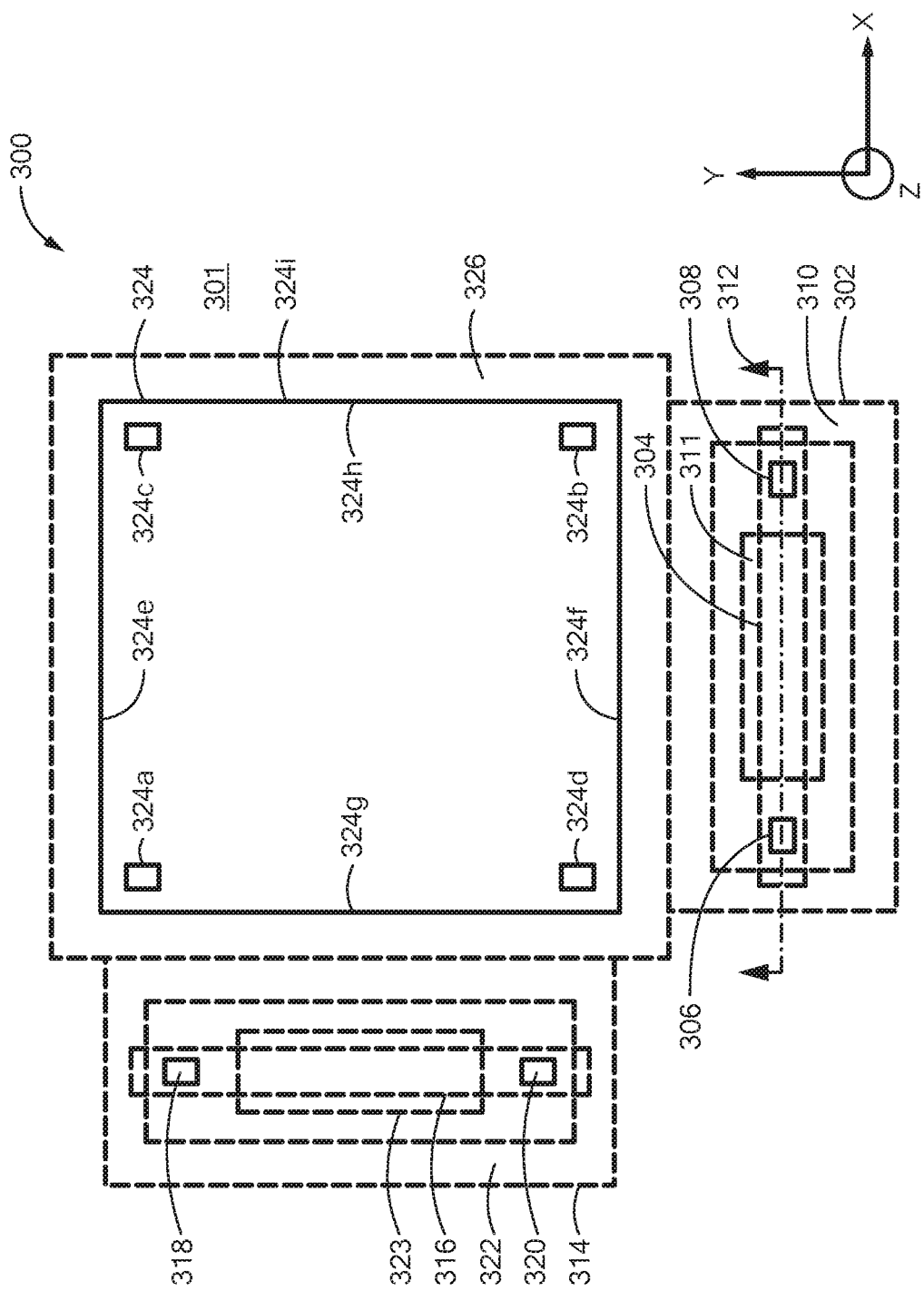
FIG. 3 is block diagram showing a top view of a substrate having a Hall effect element and two resistors of the type shown in FIG. 2

Referring Now to FIG. 3, an electronic circuit 300 is formed upon an epitaxial layer 301 over a substrate under the epitaxial layer 301.

The electronic circuit 300 can include a Hall effect element 324, shown in part as a bounded portion 324i of the epitaxial layer 301, bounded by an electrical barrier 326 to electron flow, the barrier defining a perimeter boundary of the Hall effect element 324. The electrical barrier 326 can be comprised of a PBL region under a P-well region, much the same as the PBL region 216 and the P-well region 214 of FIG. 2.

The bounded portion 324i can form a Hall plate of the Hall effect element 324. Over the bounded portion 324i can be a field plate, which, in some embodiments, can be formed in a metal layer. The field plate can have approximately the same dimensions in the x-y plane as the bounded portion 324i, thus reference designator 324i can be used to refer to either the Hall plate, i.e., bounded portion, in the epitaxial layer 301 or the field plate above the epitaxial layer 301.

The Hall effect 324 element can include four pickups 324a, 324b, 324c, 324d, which can be used and coupled in the same way, or in a similar way, as the four terminals 118a, 118b, 118c, 118d described above in conjunction with FIG. 1 FIG. 1. As described above in conjunction with FIG. 2, above the four pickups 324a, 324b, 324c, 324d can be a corresponding four contacts (not shown) formed in a metal layer.

The bounded portion 324i of the Hall effect element 324 can, in some embodiments, form a square shape having four sides or edges 324e, 324f, 324g, 324h. However, in other embodiments, the bounded portion 324i (and the Hall plate and field plate) need not have a square shape. For example, a Hall element with a wide cross shape is described I U.S. Pat. No. 8,357,983, issued Jan. 22, 2013, which is assigned to the assignee of the present invention and which is incorporated by reference herein in its entirety.

It should be understood that the Hall effect element 324 is a horizontal or planar Hall effect element, which has an axis of maximum sensitivity parallel to a z-axis.

The electronic circuit 300 can also include a resistor 302 (i.e., a vertical epi resistor), which can be the same as or similar to the resistor 110 of FIG. 1 and the resistor 200 of FIG. 2.

The resistor 302 can include an NBL region 304, a P-well region 311, a barrier region 310, and two pickups 306, 308, which can be the same as or similar to the NBL region 204, the P-well region 212, the barrier region formed from the P-well region and the PBL region 214, 216, and the pickups 208, 210 of FIG. 2.

The NBL region 304 has a length with a length dimension parallel to the x-axis and a width with a width dimension parallel to the y-axis. The length dimension of the NBL region 304 can be parallel to the edge 324f of the Hall effect element 324. However, in other embodiments, the length dimension is not parallel to an edge of the Hall effect element 324.

While the width dimension of the NBL region 304 is shown to be less than the length dimension, in other embodiments, the width dimension can be equal to or greater than the length dimension.

In some embodiments, the resistor 302 is the only such resistor. However, in some embodiments, the resistor 302 can be a first resistor and the electronic circuit 300 can include a second resistor 314 (i.e., a vertical epi resistor). The second resistor 314 can be coupled in series with or in parallel with the first resistor 302 to form one equivalent resistor that can be used as the resistor 110 of FIG. 1. When coupled in series, all of the reference current 108a of FIG. 1 passes through both resistors 302, 314. When coupled in parallel, at least a first portion of the reference current 108a passes through the first resistor 302 and a second portion of the reference current 108a passes through the second resistor 314. Portions of the reference current 108a that pass through the first and second resistors 302, 314 may be approximately equal, or they may be different.

The second resistor 314 can include an NBL region 316, a P-well region 323, a barrier region 322, and two pickups 318, 320, which can be the same as or similar to the NBL region 204, the P-well region 212, the barrier region formed from the P-well region and the PBL region 214, 216, and the pickups 208, 210 of FIG. 2.

The NBL region 316 has a length with a length dimension parallel to the y-axis and a width with a width dimension parallel to the x-axis. The length dimension of the NBL region can be parallel to the edge 324g of the Hall effect element 324. However, in other embodiments, the length dimension is not parallel to an edge of the Hall effect element, 324. As shown, the length dimension of the NBL region 304 of the first resistor 302 is substantially perpendicular to the length dimension of the NBL region 316 of the second resistor 314. However, other relative orientations are also possible.

While the width dimension of the NBL region 316 is shown to be less than the length dimension, in other embodiments, the width dimension can be equal to or greater than the length dimension.

The electronic circuit 300 can form part of the electronic circuit 100 of FIG. 1. Transistors are not shown in FIG. 3, but it will be recognized that transistors (e.g., FETs) can be formed proximate to the electronic circuit 300 to form the electronic circuit 100 or any of the electronic circuits described in figures below.

Referring briefly again to FIG. 2, it is stated above that the piezoelectric coefficient of the resistances 218, 220 is about the same for stresses in the x-direction, in the y-direction, and in the z-direction. Having the first resistor 302 coupled in series or parallel with the second resistor 314 to result in an equivalent resistor can assure that the piezoelectric coefficient can remain more the same for stresses along different axes.

As described above in conjunction with FIG. 2, the resistances 218, 220 have a piezo-resistance coefficient of about $53.4 \times 10^{-11}$ per Pascal, and thus, the resistors 302, 314 change resistance value with stresses in the x and y direction upon the substrate 202 according to $53.4 \times 10^{-11}$ per Pascal.

The Hall effect elements 118, 324 have a piezo-Hall coefficient of about $45 \times 10^{-11}$ per Pascal for stresses in the x and y directions, which is close to the piezo-resistance coefficient above.

The change in sensitivity of the overall electronic circuit 300 (or more precisely, the circuit 100 of FIG. 1) due to stress of the substrate 301 is governed by piezo-Hall and piezo-resistive effects according to the above coefficients.

It can be shown that the change of sensitivity of the electronic circuit 100 of FIG. 1 with stress is approximately:

$$\frac{\Delta S}{S} = (45 \times 10^{-11} 1/\text{Pa} - 53.4 \times 10^{-11} 1/\text{Pa})(\sigma_x + \sigma_y) \quad (1)$$

where:
$\sigma_x$=stress parallel to the x-axis
$\sigma_y$=stress parallel to the y-axis
S=nominal sensitivity
$\Delta S$=change in sensitivity
Therefore:

$$\frac{\Delta S}{S} = -8.4 \times 10^{-11} 1/\text{Pa}(\sigma_x + \sigma_y) = -8.4\%/\text{GPa}(\sigma_x + \sigma_y) \quad (2)$$

where:
GPa=GigaPascals=$10^9$ Pascals

Were it not for compensation by the resistors described herein, the Hall effect element alone would be influenced by stress according to the following equation:

$$\begin{aligned}\frac{\Delta S}{S} &\cong P_{12}(\sigma_x + \sigma_y) \\ &= 45 \times 10^{-11} 1/\text{Pa}(\sigma_x + \sigma_y) \\ &= 45\%/\text{GPa}(\sigma_x + \sigma_y)\end{aligned} \quad (3)$$

where:
$P_{12}$=the above-described piezo-Hall coefficient

Thus, comparing equation (3) to equation (2), the resistors described herein, e.g., the resistor 200 of FIG. 2, result in a substantial reduction of sensitivity change due to stress.

While first and second resistors 302, 314 are shown, in other embodiments, there can be more than two such resistors, each responsive to changes in stress in the substrate, coupled in series or coupled in parallel or in any combination thereof.

Figure 4:
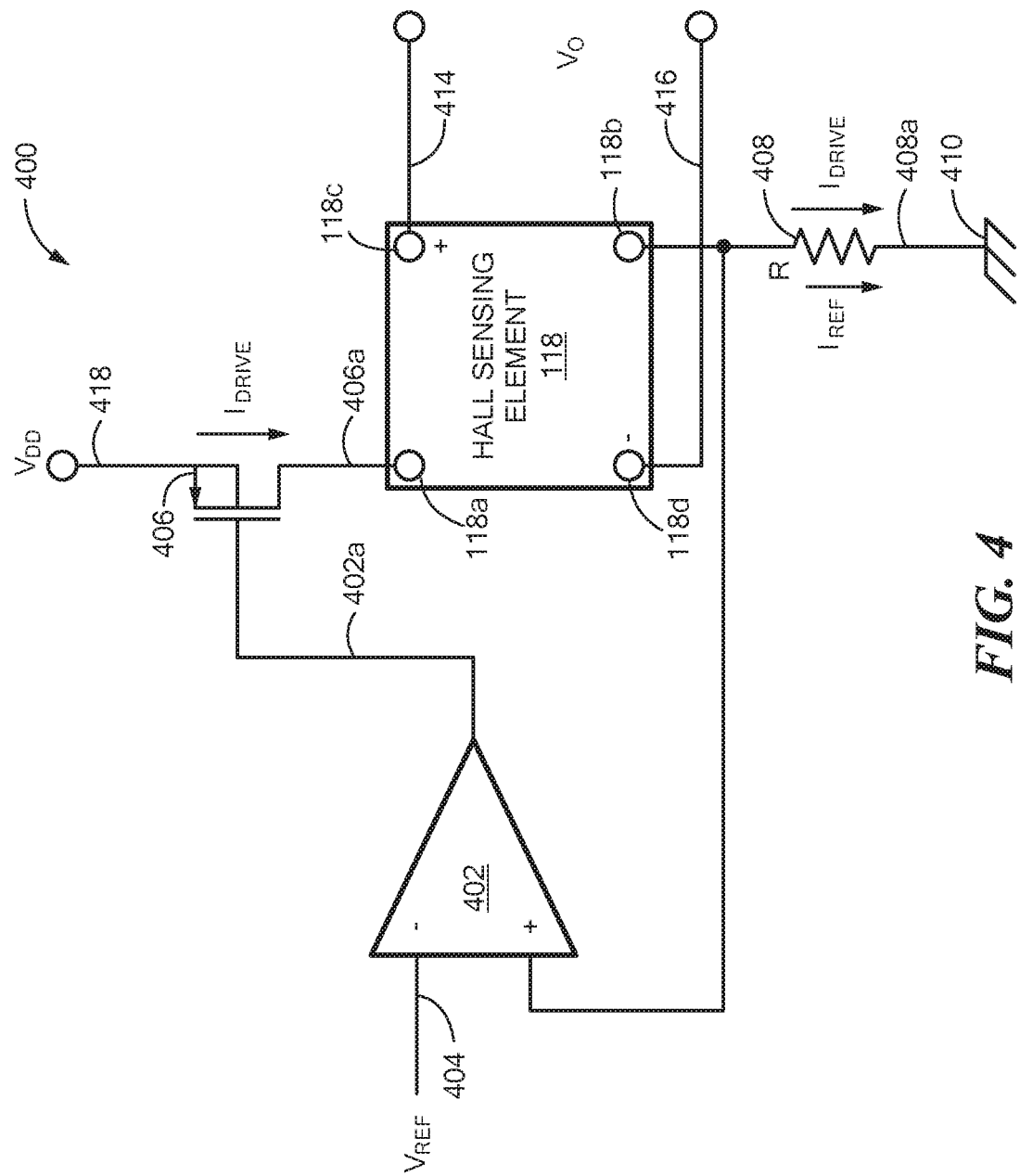
FIG. 4 is a block diagram showing another electronic circuit having a Hall effect element driven with a current generator, the current generator having a vertical epi resistor that can be of a type shown in FIG. 2.

Referring now to FIG. 4, in which like elements of FIG. 1 are shown having like reference designations, another electronic circuit 400 can include an operation amplifier coupled to receive a reference voltage 404 at an inverting input.

The operational amplifier 402 is operable to generate a control signal 402a. An FET 406 can be coupled to receive the control signal 402a at a gate terminal thereof. A source terminal of the FET 406 can be coupled to receive a voltage 418. A drive current 406a can be output from a drain terminal 406 of the FET.

The drive current 406a can be received by the first terminal 118a of the Hall effect element 118. The drive current 406a can pass from the first terminal 118a, through the Hall effect element 118, to the second terminal 118b, and thereafter to a first terminal of a resistor 408 (i.e., a vertical epi resistor), which can be the same as or similar to the resistor 110 of FIG. 1, and the same as or similar to the resistors described above in conjunction with FIGS. 2 and 3. A second terminal of the resistor 408 can be coupled to a voltage reference, for example, ground 410. The drive current 406*a* is equivalent to a drive current 408*a* that passes through the resistor 408

A differential voltage output signal 414, 416 can be generated between the third and fourth terminals 118*c*, 118*d*, respectively, of the Hall effect element 118. The differential voltage 414, 416 is related to an amplitude of the drive current 406*a*, and also related to a magnitude of an external magnetic field.

With the electronic circuit 400, it will be appreciated that the drive current 406*a* is essentially also a reference current generated by the electronic circuit 400 forming a current sink, but without the current mirror 112 of FIG. 1.

Operation of the electronic circuit 400 is similar to operation of the electronic circuit 100 of FIG. 1. As with the electronic circuit 100, the resistor 408 can be of a type described above in conjunction with FIGS. 2 and 3. The resistor 408 can compensate for variations in the sensitivity of the Hall effect element 118 that occur due to stress of the substrate on which the electronic circuit 400 is disposed.

Figure 5:
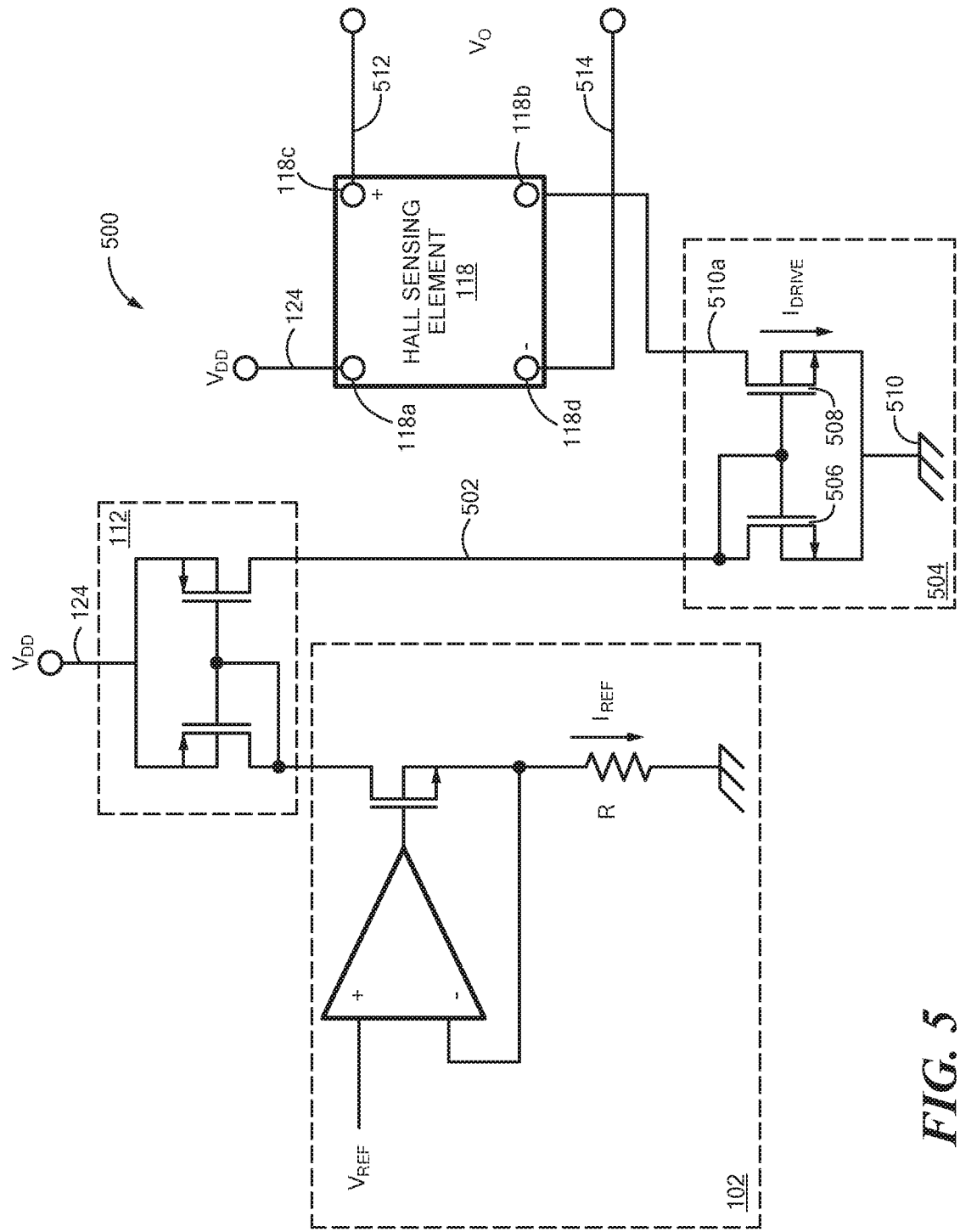
FIG. 5 is a block diagram showing another electronic circuit having a Hall effect element driven with a current generator and two current mirrors, the current generator having a vertical epi resistor that can be of a type shown in FIG. 2.

Referring now to FIG. 5, in which like elements of FIG. 1 are shown having like reference designations, another electronic circuit 500 can include the current generator 102 and the current mirror 112 of FIG. 1. Here, however, the current mirror 112 is operable to generate an intermediate current 502 received by a second current mirror 504. In particular, a third current mirror FET 506, here shown to be an N-Channel FET, is coupled to receive the intermediate current 502 at a drain terminal. The drain terminal of the third current mirror FET 506 is coupled to the gate terminal of the third current mirror FET 506. The gate terminal of the third current mirror FET 506 is coupled to a gate terminal of a fourth current mirror FET 508. A source terminal of the third current mirror FET 506 is coupled to a source terminal of the fourth current mirror FET 508, both of which are coupled to a reference voltage, for example, a ground 510. A drain terminal of the fourth current mirror FET 508 is operable to generate (i.e., receive) a drive current 510*a*.

The Hall effect element 118 is coupled to receive a voltage 124 at the first terminal 118*a*. The second terminal 118*b* of the Hall effect elements 118 is coupled such that the drive current 510*a* is extracted therefrom.

Operation of the electronic circuit 500 is similar to operation of the electronic circuit 100 of FIG. 1. In operation, a differential voltage output signal 512, 514 can be generated between the third and fourth terminals 118*c*, 118*d*, respectively, of the Hall effect element 118. The differential voltage 512, 514 is related to an amplitude of the drive current 510*a*, and also related to a magnitude of an external magnetic field.

As with the electronic circuit 100, the resistor 110 can be of a type described above in conjunction with FIGS. 2 and 3. The resistor 110 can compensate for variations in the sensitivity of the Hall effect element 118 that occur due to stress of the substrate on which the electronic circuit 500 is disposed.

In some embodiments, the drive current 510*a* has the same current value as the reference current 108*a*. However, it will be understood that, by scaling relative drain-source resistances of the first, second, third and fourth current mirror FETs 114, 116, 506, 508, respectively, e.g., by scaling relative physical sizes, the drive current 510*a* can be greater than or less than the reference current 108*a*.

While field effect transistors are shown in embodiments above, in other embodiments any of the field effect transistors can be replaced with a bipolar junction transistor or another type of transistor.

While certain arrangements are shown above that use current mirrors, it should be understood that, in other arrangements, current mirrors can be arranged in different ways, for example, using more current mirrors.

With the above arrangements, changes in resistance of the resistors disposed in the epitaxial layer with stress of the substrate, and resulting changes of the drive current applied to the Hall effect element, can compensate for changes in the sensitivity of the Hall effect element with stress of the substrate. Accordingly, it should be appreciated that reference currents and drive currents described herein can change according to changes of stress experienced by the substrate.

Figure 6:
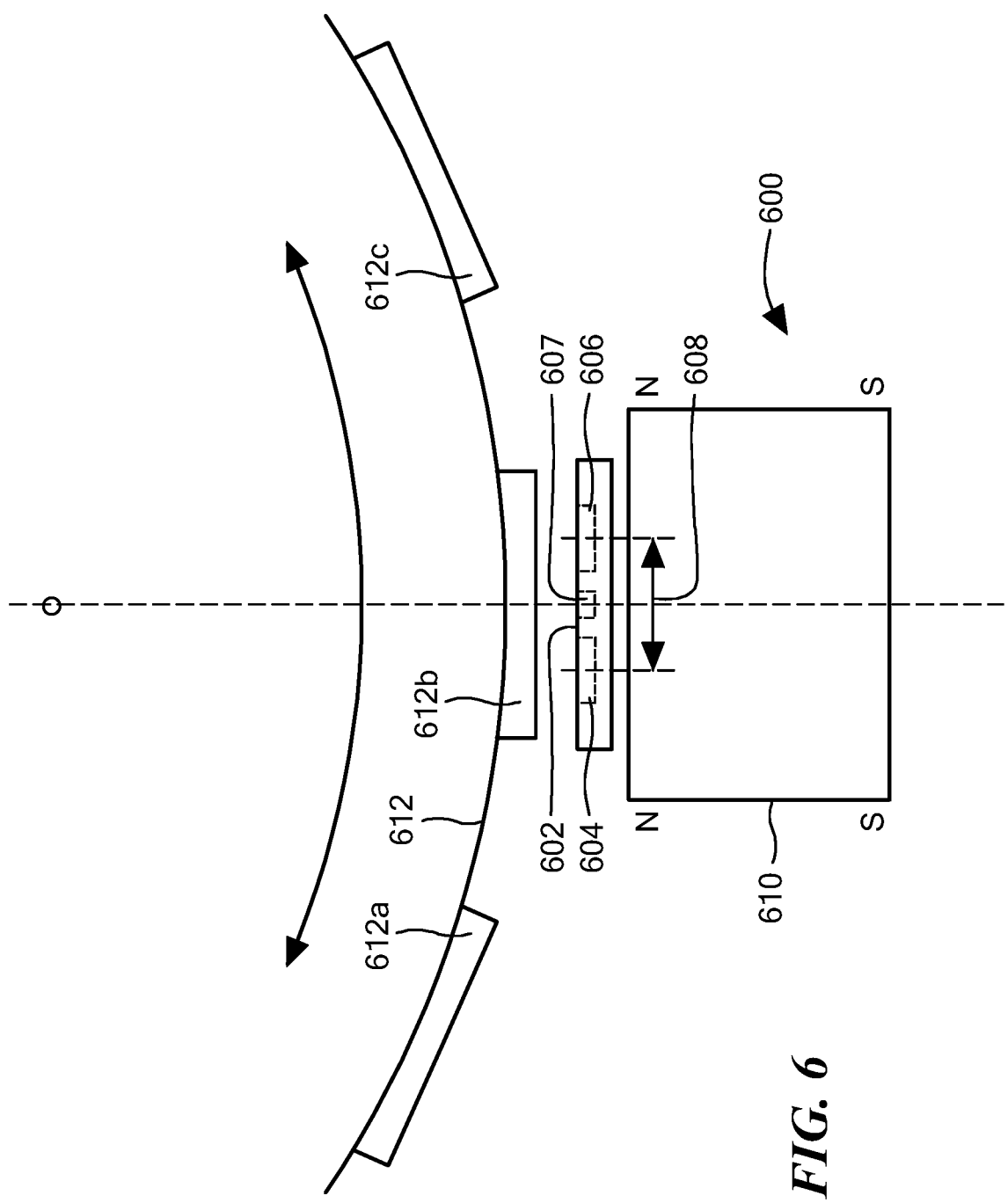
FIG. 6 is a block diagram of a magnetic field sensor that has Hall effect elements upon a semiconductor substrate and a magnet as used in a back-biased arrangement.

Referring now to FIG. 6, a magnetic field sensor 600 can include a substrate 602 upon which, within which, or over which may be constructed Hall effect element regions 604, 606. Each of the Hall effect regions 604, 606 can include one or more Hall effect elements coupled in series or in parallel. In some embodiments, the substrate 602 is a semiconductor substrate and the Hall effect regions 604, 606 are constructed within an epi layer (not shown) disposed over a surface of the semiconductor substrate 602.

In some embodiments, the magnetic field sensor 600 can include a magnet 610 used in a back biased arrangement.

Operationally, the magnetic field sensor can be disposed proximate to a ferromagnetic object operable to rotate. The ferromagnetic object can be, for example, a gear 612 having gear teeth, e.g., 612*a*, 612*b* 612*c* and gear valleys (all referred to here as gear features). The gear 612 is not a part of the magnetic field sensor 600.

In operation of the back biased magnetic field sensor 600, when the gear 612 turns, the gear features cause perturbations of amplitude and angle of magnetic fields as generated by the magnet and as experienced by Hall effect elements within the Hall effect element regions 604, 606.

The perturbations of the magnetic fields can be sensed by an electronic circuit 607 also disposed upon, within, or over the substrate 602. A rate of the perturbations can be related to a rotation speed of the gear 612. The Hall effect regions 604, 606 and the electronic circuit 607 are collectively referred to herein as an electronic circuit.

In some embodiments, Hall effect elements within the Hall effect region 604 are differentially combined with Hall effect elements within the Hall effect region 606.

In some embodiments, a distance 608 parallel to a major surface of the substrate 602 can be between about fifty percent and about on hundred percent of a width a gear feature, e.g., the gear tooth 612*b*. This distance can be a width of the substrate 602 in a direction parallel to the page. It is known that a smaller substrate can result in greater circuit yield and lower cost. Thus, it is desirable to maintain the above-mentioned distance without increasing the width of the substrate more than is necessary.

With the above-described differential arrangement and with the above-described distance 608, the magnetic field sensor 600 can operate as a so-called edge detector, as opposed to a so-called tooth detector. With an edge detector, the electronic circuit 607 tends to generate an output signal with zero amplitude when the Hall effect element regions 604, 606 are both proximate to a gear tooth and proximate to a gar valley. However, when an edge of a gear tooth is between the two Hall effect element regions 604, 606, the output signal does not have a zero amplitude.

In some embodiments, the electronic circuit 607 is operable to detect a sign of a phase difference between signals generated by the Hall effect region 604 and by the Hall effect region 606. It will be understood that the sign of the phase difference is indicative of a direction of rotation of the gear 612.

Embodiments shown below in conjunction with FIGS. 7-14 show physical placements of combinations of Hall effect elements and vertical epi resistors and may be used in conjunction with the current driver arrangements of FIG. 1, 4, or 5. A first such current driver can use a first one or more vertical epi resistors coupled in series or in parallel and can drive a first Hall effect element alone or in series or parallel combinations with other Hall effect elements. A second such current driver can use a second one or more vertical epi resistors coupled in series or in parallel and can drive a second Hall effect element alone or in series or parallel combinations with other Hall effect elements.

Vertical epi resistors described below can be of a type described above in conjunction with FIG. 2, and can be used in conjunction with the current driver circuits of FIG. 1, 4, or 5

It is known that substrate stress near edges of a substrate can be high and can be irregular. Thus, it is desirable to keep the various vertical epi resistors away from the edges of the substrate as is described in conjunction with figures below. Desirably, geometric centers of each one of the various vertical epi resistors can be farther away from an edge of a substrate than is a geometric center of each of the associated Hall effect elements.

Figure 7:
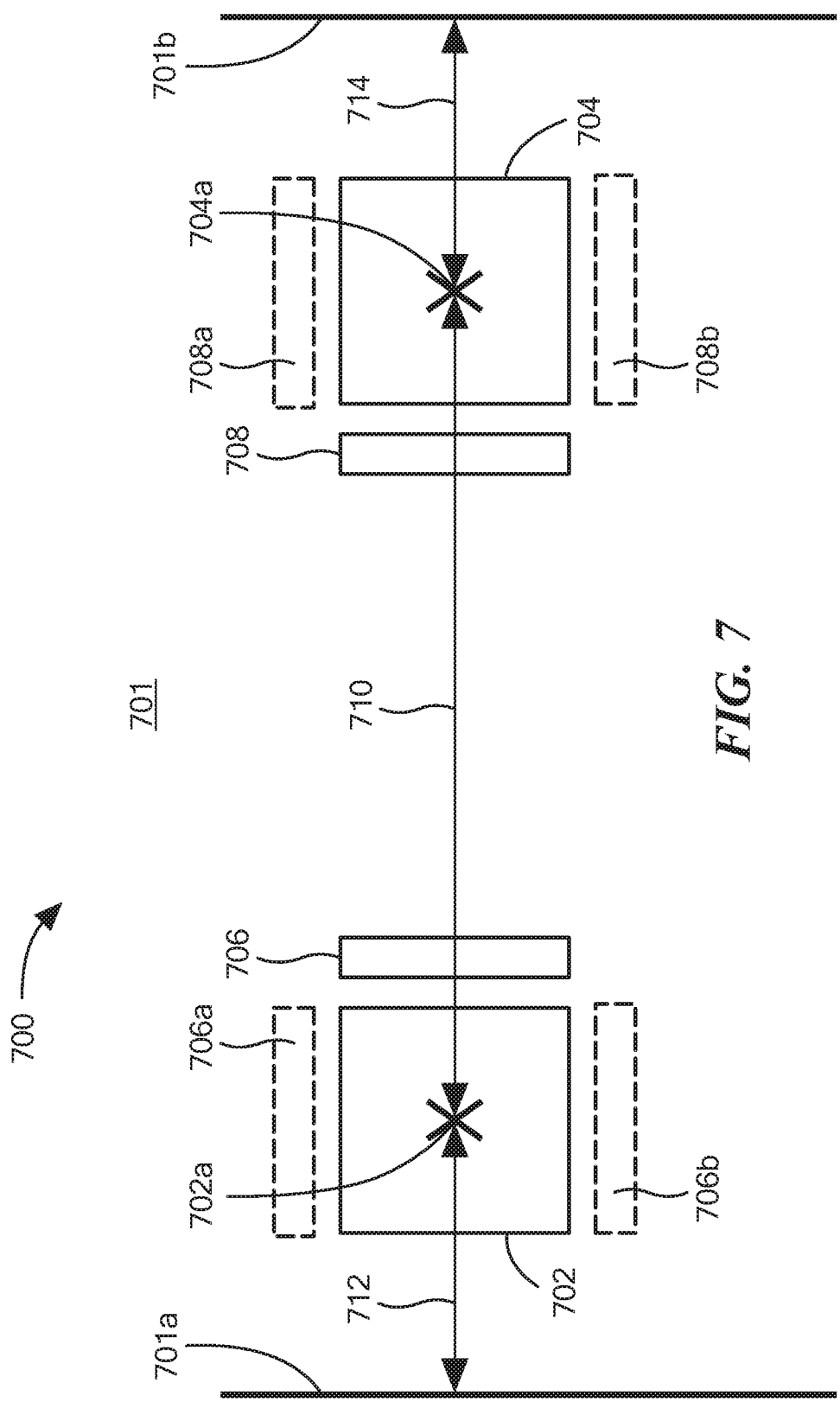
FIG. 7 is a block diagram showing a top view of an illustrative substrate having two Hall effect elements and two vertical epi resistors.

Referring now to FIG. 7, an electronic circuit 700 can include first and second Hall effect elements 702, 704, respectively, disposed upon, within, or over a substrate 701. The substrate 701 can have first and second edges 701a, 701b, respectively. The first Hall effect element 702 can have a geometric center 702a and the second Hall effect element 704 can have a geometric center 704a. A distance 710 can be the same as or similar to the distance 608 of FIG. 6.

The geometric center 702a is a distance 712 from the first edge 701a and the geometric center 704a is a distance 714 from the second edge 701b.

The electronic circuit 700 can also include first and second vertical epi resistors 706, 708, respectively, positioned as shown. It should be understood that a distance between a geometric center of the first vertical epi resistor 706 and the first edge 701a is greater than or equal to the distance 712. It should also be understood that a distance between a geometric center of the second vertical epi resistor 708 and the second edge 701b is greater than or equal to the distance 714.

Alternate positions 706a, 706b of the first vertical epi resistor 706 are shown with proximate dashed lines. Alternate positions 708a, 708b of the second vertical epi resistor 708 are also shown with dashed lines. Even when using the alternate positions 706a, 706b, 708a, 708b, still, a distance between a geometric center of the first vertical epi resistor at the alternate positions 706a, 706b and the first edge 701a is greater than or equal to the distance 712. Also, a distance between a geometric center of the second vertical epi resistor at the alternate positions 708a, 708b and the second edge 701b is greater than or equal to the distance 714.

The first and second Hall effect elements 702, 704, respectively, and the first and second vertical epi resistors 706, 708, respectively, may be used in conjunction with two current driver arrangement, each like the current driver arrangements of FIG. 1, 4, or 5. A first such current driver can use the first vertical epi resistor 706 and can drive the first Hall effect element 702. A second such current driver can use the second vertical epi resistor 708 and can drive the second Hall effect element 704.

In some embodiments, one of, or each one of, the first and second vertical epi resistors 706, 708 can be coupled in series with or in parallel with other vertical epi resistors. In some embodiments, one of, or each one of, the first and second Hall effect elements 702, 704 can be coupled in series with or in parallel with other Hall effect elements.

Figure 8:
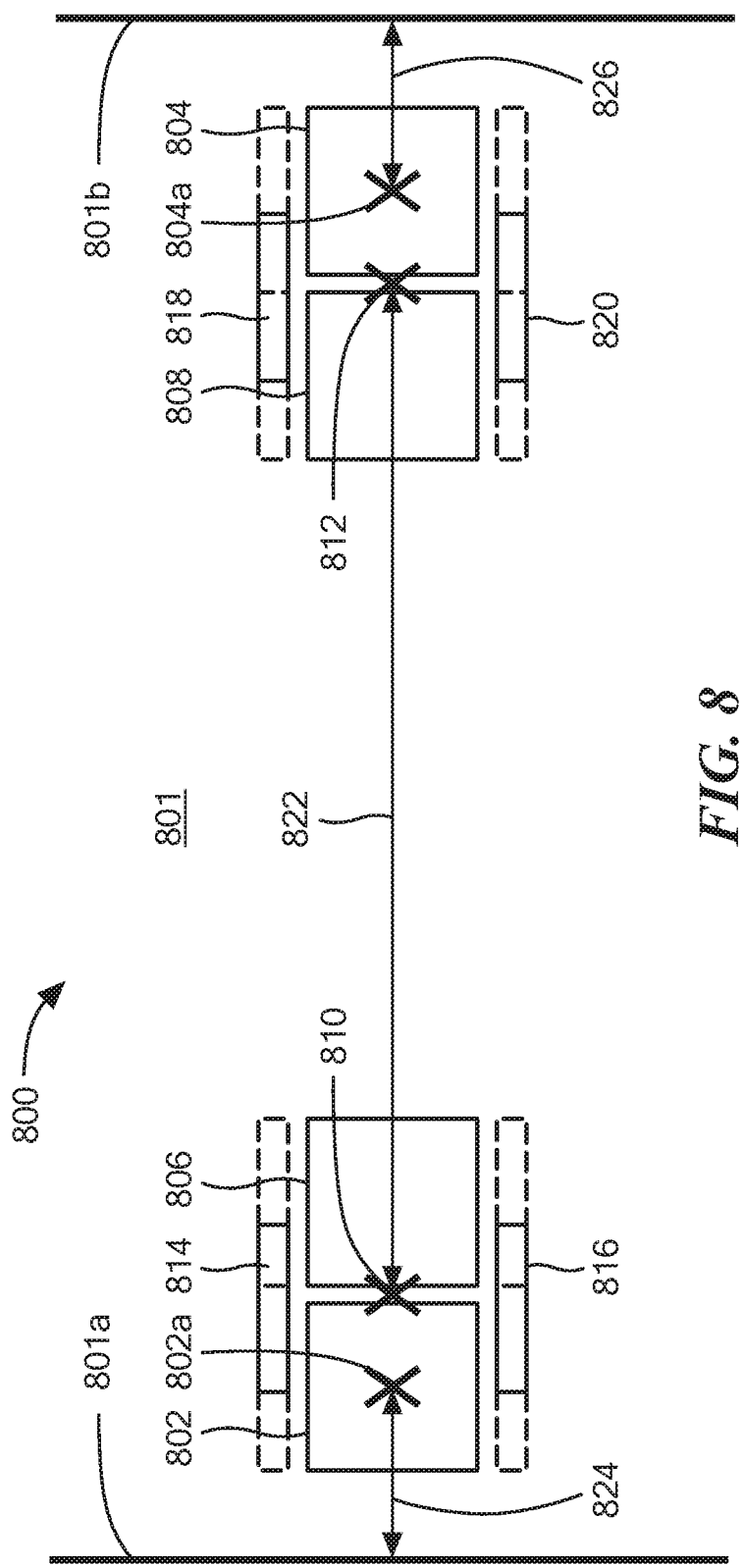
FIG. 8 is a block diagram showing a top view of an illustrative substrate having four Hall effect elements and four vertical epi resistors.

Referring now to FIG. 8, an electronic circuit 800 can include first and second Hall effect elements 802, 804, respectively, disposed upon, within, or over a substrate 801. The substrate 801 can have first and second edges 801a, 801b, respectively. The first Hall effect element 802 can have a geometric center 802a proximate to the first edge 801a and the second Hall effect element 804 can have a geometric center 804a proximate to the second edge 801b.

The geometric center 802a is a distance 824 from the first edge 801a and the geometric center 804a is a distance 826 from the second edge 801b.

The electronic circuit 800 can also include third and fourth Hall effect elements 806, 808 respectively, disposed upon, within, or over the substrate 801. The third Hall effect element 806 can be disposed proximate to the first Hall effect element 802 and the fourth Hall effect element 808 can be disposed proximate to the second Hall effect element 804.

The first and third Hall effect elements 802, 806 taken together have a geometric center 810. The second and fourth Hall effect elements 804, 808 taken together have a geometric center 812. A distance 822 can be the same as or similar to the distance 608 of FIG. 6.

In some embodiments, the first and third Hall effect element 802, 806 can be coupled together in series or in parallel, forming a first effective Hall effect element (i.e., having one differential output). In some embodiments, the second and fourth Hall effect element 804, 808 can be coupled together in series or in parallel, forming a second effective Hall effect element (i.e., having one differential output).

The electronic circuit 800 can also include first and second vertical epi resistors 814, 818, respectively, positioned as shown. It should be understood that a distance between a geometric center of the first vertical epi resistor 814 and the first edge 801a is greater than or equal to the distance 824. It should also be understood that a distance between a geometric center of the second vertical epi resistor 818 and the second edge 801b is greater than or equal to the distance 826.

In some embodiments, the electronic circuit can also include third and fourth vertical epi resistors 816, 820, respectively.

In some embodiments, the first and third vertical epi resistor 814, 816 can be coupled together in series or in parallel, forming a first effective vertical epi resistor (i.e., have two terminals). In some embodiments, the second and fourth vertical epi resistors 818, 820 can be coupled together in series or in parallel, forming a second effective vertical epi resistor (i.e., having two terminals).

Alternate positions of the first vertical epi resistor 814 are shown with proximate dashed lines. Alternate positions of the second vertical epi resistor 818 are also shown with dashed lines. Even when using the alternate positions still, a distance between a geometric center of the first vertical epi resistor at the alternate positions and the first edge 801a is greater than or equal to the distance 824. Also, a distance between a geometric center of the second vertical epi resistor at the alternate positions and the second edge 801b is greater than or equal to the distance 826.

Similarly, alternate positions of the third vertical epi resistor 816 are shown with proximate dashed lines. Alternate positions of the fourth vertical epi resistor 820 are also shown with proximate dashed lines. Even when using the alternate positions still, a distance between a geometric center of the third vertical epi resistor at the alternate positions and the first edge 801a is greater than or equal to the distance 824. Also, a distance between a geometric center of the second vertical epi resistor at the alternate positions and the second edge 801b is greater than or equal to the distance 826.

The first and third Hall effect elements 802, 806, respectively, and the first and third vertical epi resistors 814, 816, respectively may be used in conjunction with a first current driver like any of the current driver arrangements of FIG. 1, 4, or 5. For these embodiments, the first and third Hall effect elements 802, 806, respectively, may be coupled in series or in parallel and the first and third vertical epi resistors 814, 816, respectively, may be coupled in series or in parallel.

Similarly, the second and fourth Hall effect elements 804, 808, respectively, and the second and fourth vertical epi resistors 818, 820, respectively may be used in conjunction with a second current driver like any of the current driver arrangements of FIG. 1, 4, or 5. For these embodiments, the second and fourth Hall effect elements 804, 808, respectively, may be coupled in series or in parallel and the second and fourth vertical epi resistors 818, 820, respectively, may be coupled in series or in parallel.

In some embodiments, one of, or each one of, the first, second, third, and fourth vertical epi resistors 814, 818, 816, 820, respectively, can be coupled in series with or in parallel with other vertical epi resistors. In some embodiments, one of, or each one of, the first, second, third and fourth Hall effect elements 802, 804, 806, 808, respectively, can be coupled in series with or in parallel with other Hall effect elements (not shown).

In some embodiments, not all of the four vertical epi resistors are provided. For example, only the first and third vertical epi resistors 814, 816, respectively, or the second and fourth vertical epi resistors 818, 820, respectively, can be provided.

Figure 9:
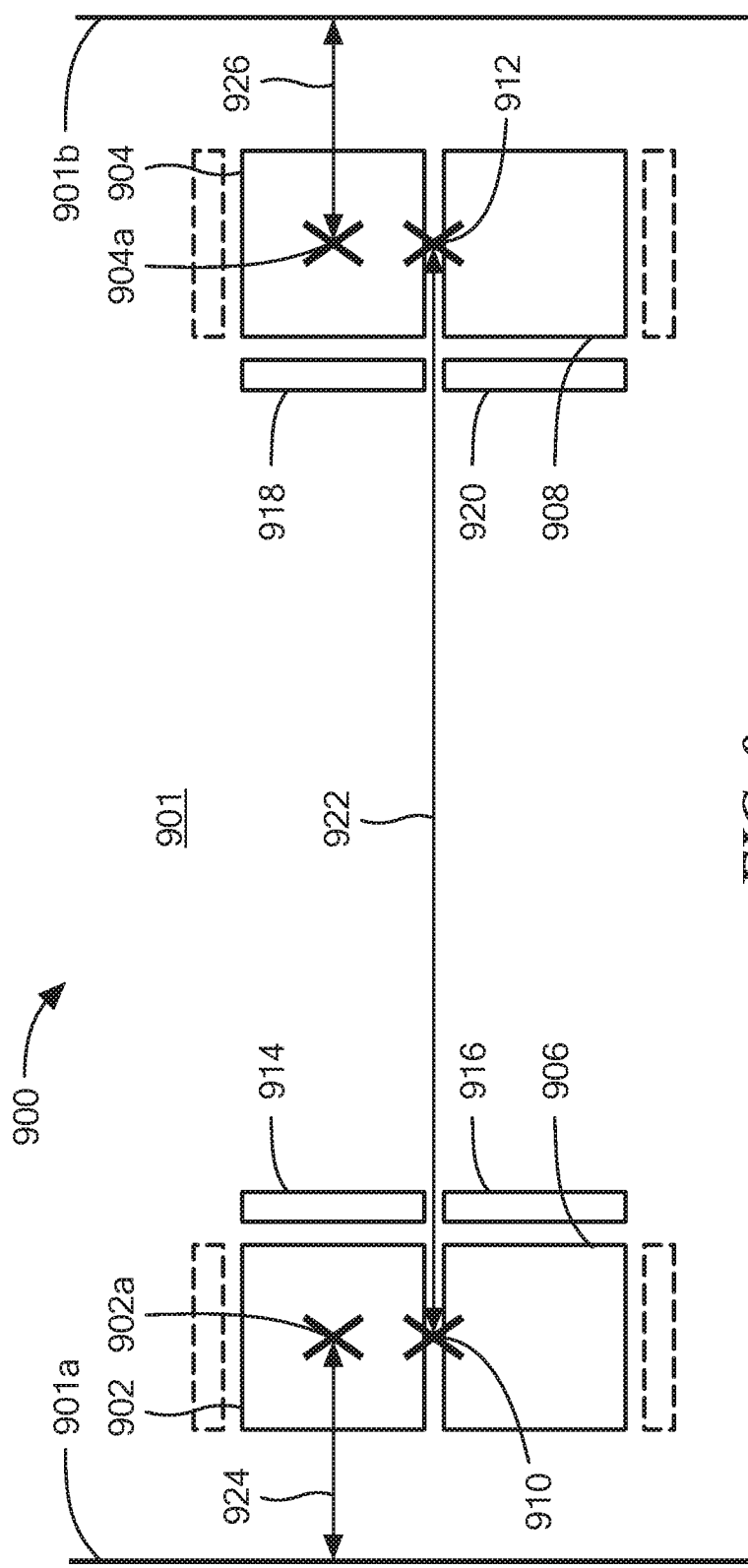
FIG. 9 is a block diagram showing a top view of another illustrative substrate having four Hall effect elements and four vertical epi resistors.

Referring now to FIG. 9, an electronic circuit 900 can include first and second Hall effect elements 902, 904, respectively, disposed upon, within, or over a substrate 901. The substrate 901 can have first and second edges 901a, 901b, respectively. The first Hall effect element 902 can have a geometric center 902a proximate to the first edge 901a, and the second Hall effect element 904 can have a geometric center 904a proximate to the second edge 901b.

The geometric center 902a is a distance 924 from the first edge 901a and the geometric center 904a is a distance 926 from the second edge 901b.

The electronic circuit 900 can also include third and fourth Hall effect elements 906, 908 respectively, disposed upon, within, or over the substrate 901. The third Hall effect element 906 can be disposed proximate to the first Hall effect element 902 and the fourth Hall effect element 908 can be disposed proximate to the second Hall effect element 904.

The first and third Hall effect elements 902, 906 taken together have a geometric center 910. The second and fourth Hall effect elements 904, 908 taken together have a geometric center 912. A distance 922 can be the same as or similar to the distance 608 of FIG. 6.

Comparing the electronic circuit 900 and 800, distances 922 and 822 can be the same, but a distance between substrate edges 901a, 901b can be smaller than a distance between substrate edges 801a, 801b, due to the linear arrangement of the Hall effect elements of the electronic circuit 900. Thus, the substrate 901 can be smaller than the substrate 801. As a result, the electronic circuit 900 can be less expensive than the electronic circuit 800.

In some embodiments, the first and third Hall effect element 902, 906 can be coupled together in series or in parallel, forming a first effective Hall effect element (i.e., having one differential output). In some embodiments, the second and fourth Hall effect elements 904, 908 can be coupled together in series or in parallel, forming a second effective Hall effect element (i.e., having one differential output).

The electronic circuit 900 can also include first and second vertical epi resistors 914, 918, respectively, positioned as shown. It should be understood that a distance between a geometric center of the first vertical epi resistor 914 and the first edge 901a is greater than or equal to the distance 924. It should also be understood that a distance between a geometric center of the second vertical epi resistor 918 and the second edge 901b is greater than or equal to the distance 926.

In some embodiments, the electronic circuit can also include third and fourth vertical epi resistors 916, 920, respectively.

In some embodiments, the first and third vertical epi resistor 914, 916 can be coupled together in series or in parallel, forming a first effective vertical epi resistor (i.e., have two terminals). In some embodiments, the second and fourth vertical epi resistors 918, 920 can be coupled together in series or in parallel, forming a second effective vertical epi resistor (i.e., having two terminals).

An alternate position of the first vertical epi resistor 914 is shown with proximate dashed lines. An alternate position of the second vertical epi resistor 918 is also shown with proximate dashed lines. Even when using the alternate positions still, a distance between a geometric center of the first vertical epi resistor at the alternate position and the first edge 901a is greater than or equal to the distance 924. Also, a distance between a geometric center of the second vertical epi resistor at the alternate position and the second edge 901b is greater than or equal to the distance 926.

Similarly, an alternate position of the third vertical epi resistor 916 is shown with proximate dashed lines. An alternate position of the fourth vertical epi resistor 920 is also shown with proximate dashed lines. Even when using the alternate positions still, a distance between a geometric center of the third vertical epi resistor at the alternate position and the first edge 901a is greater than or equal to the distance 924. Also, a distance between a geometric center of the second vertical epi resistor at the alternate position and the second edge 901b is greater than or equal to the distance 926.

The first and third Hall effect elements 902, 906, respectively, and the first and third vertical epi resistors 914, 916, respectively may be used in conjunction with a first current driver like any of the current driver arrangements of FIG. 1, 4, or 5. For these embodiments, the first and third Hall effect elements 902, 906, respectively, may be coupled in series or in parallel and the first and third vertical epi resistors 914, 916, respectively, may be coupled in series or in parallel.

Similarly, the second and fourth Hall effect elements 904, 908, respectively, and the second and fourth vertical epi resistors 918, 920, respectively may be used in conjunction with a second current driver like any of the current driver arrangements of FIG. 1, 4, or 5. For these embodiments, the second and fourth Hall effect elements 904, 908, respectively, may be coupled in series or in parallel and the second and fourth vertical epi resistors 918, 920, respectively, may be coupled in series or in parallel.

In some embodiments, one of, or each one of, the first, second, third, and fourth vertical epi resistors 914, 918, 916, 920, respectively, can be coupled in series with or in parallel with other vertical epi resistors. In some embodiments, one of, or each one of, the first, second, third and fourth Hall effect elements 902, 904, 906, 908, respectively, can be coupled in series with or in parallel with other Hall effect elements (not shown).

In some embodiments, not all of the four vertical epi resistors are provided. For example, only the first and second vertical epi resistors 914, 918, respectively, or the second and fourth vertical epi resistors 918, 920, respectively, can be provided.

Figure 10:
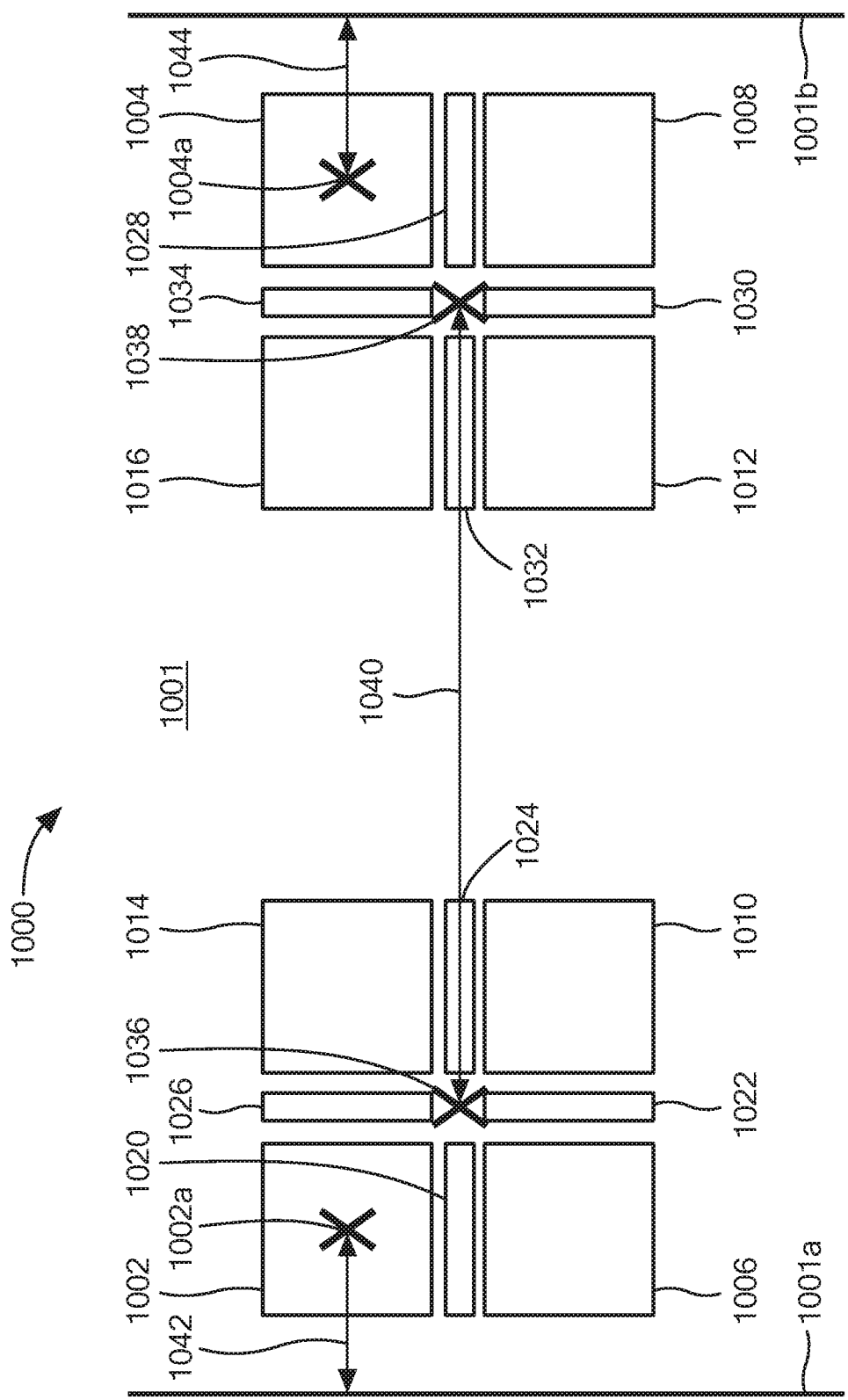
FIG. 10 is a block diagram showing a top view of an illustrative substrate having eight Hall effect elements and eight vertical epi resistors.

Referring now to FIG. 10, an electronic circuit 1000 can include first and second Hall effect elements 1002, 1004, respectively, disposed upon, within, or over a substrate 1001. The substrate 1001 can have first and second edges 1001a, 1001b, respectively. The first Hall effect element 1002 can have a geometric center 1002a proximate to the first edge 1001b and the second Hall effect element 1004 can have a geometric center 1004a proximate to the second edge 1001b.

The geometric center 1002a can be a distance 1042 from the first edge 1001a and the geometric center 1004a can be a distance 1044 from the second edge 1001b.

The electronic circuit 1000 can also include third, fourth, fifth, sixth, seventh, and eighth Hall effect elements 1006, 1008, 1010, 1012, 1014, 1016 respectively, disposed upon, within, or over the substrate 1001. The third Hall effect element 1006 can be disposed proximate to the first Hall effect element 1002, the fourth Hall effect element 1008 can be disposed proximate to the second Hall effect element 1004, the fifth Hall effect element 1010 can be disposed proximate to the third Hall effect element 1006, the sixth Hall effect element 1012 can be disposed proximate to the fourth Hall effect element 1008, the seventh Hall effect element 1014 can be disposed proximate to the fifth Hall effect element 1010, and the eighth Hall effect element 1016 can be disposed proximate to the sixth Hall effect element 1012.

The first, third, fifth, and seventh Hall effect elements 1002, 1006, 1010, 1014, respectively, taken together have a geometric center 1036. The second, fourth, sixth, and eighth Hall effect elements 1004, 1008, 1012, 1016, respectively, taken together, have a geometric center 1038. A distance 1040 can be the same as or similar to the distance 608 of FIG. 6.

In some embodiments, the first, third, fifth, and seventh Hall effect element 1002, 1006, 1010, 1014 can be coupled together in a rectangular arrangement in series or in parallel, forming a first effective Hall effect element (i.e., having one differential output). In some embodiments, the second, fourth, sixth, and eighth Hall effect elements 1004, 1008, 1012, 1016 can be coupled together in a rectangular arrangement in series or in parallel, forming a second effective Hall effect element (i.e., having one differential output).

The electronic circuit 1000 can also include first and second vertical epi resistors 1020, 1028, respectively, positioned as shown, which can be proximate to the first and second Hall effect elements 1002, 1004, respectively. It should be understood that a distance between a geometric center of the first vertical epi resistor 1020 and the first edge 1001a is greater than or equal to the distance 1042. It should also be understood that a distance between a geometric center of the second vertical epi resistor 1028 and the second edge 1001b is greater than or equal to the distance 1044.

In some embodiments, the electronic circuit can also include third, fourth, fifth, sixth, seventh, and eighth vertical epi resistors 1022, 1030, 1024, 1032, 1026, 1034, respectively. Like the first and second vertical epi resistors 1020, 1028, the third, fourth, fifth, sixth, seventh, and eighth vertical epi resistors 1022, 1030, 1024, 1032, 1026, 1034 can have respective geometric centers each further from the edges 1001a, 1001b than the distances 1042, 1044.

In some embodiments, the first, third, fifth, and seventh vertical epi resistor 1020, 1022, 1024, 1026 can be coupled together in series or in parallel, forming a first effective vertical epi resistor (i.e., have two terminals). In some embodiments, the second, fourth, sixth, and eighth vertical epi resistors 1028, 1030, 1032, 1034 can be coupled together in series or in parallel, forming a second effective vertical epi resistor (i.e., having two terminals).

Alternate positions of the eight vertical epi resistors are not shown, but can be achieved.

The first, third, fifth, and seventh Hall effect elements 1002, 1006, 1010, 1014, respectively, and the first, third, fifth, and seventh vertical epi resistors 1020, 1022, 1024, 1026, respectively, may be used in conjunction with a first current driver like any of the current driver arrangements of FIG. 1, 4, or 5. For these embodiments, the first, third, fifth, and seventh Hall effect elements 1002, 1006, 1010, 1014, respectively, may be coupled in series or in parallel and the first, third, fifth, and seventh vertical epi resistors 1020, 1022, 1024, 1026, respectively, may be coupled in series or in parallel.

Similarly, the second, fourth, sixth, and eighth Hall effect elements 1004, 1008, 1012, 1016, respectively, and the second, fourth, sixth, and eighth vertical epi resistors 1028, 1030, 1032, 1034, respectively, may be used in conjunction with a second current driver like any of the current driver arrangements of FIG. 1, 4, or 5. For these embodiments, the second, fourth, sixth, and eighth Hall effect elements 1004, 1008, 1012, 1016, respectively, may be coupled in series or in parallel and the second, fourth, sixth, and eighth vertical epi resistors 1028, 1030, 1032, 1034, respectively, may be coupled in series or in parallel.

In some embodiments, one of, or each one of, the eight vertical epi resistors can be coupled in series with or in parallel with other vertical epi resistors. In some embodiments, one of, or each one of, the eight Hall effect elements can be coupled in series with or in parallel with other Hall effect elements (not shown).

In some embodiments, not all of the eight vertical epi resistors are provided. For example, only the first and second vertical epi resistors 1020, 1028, respectively, or another pair, or two pairs, can be provided.

Figure 11:
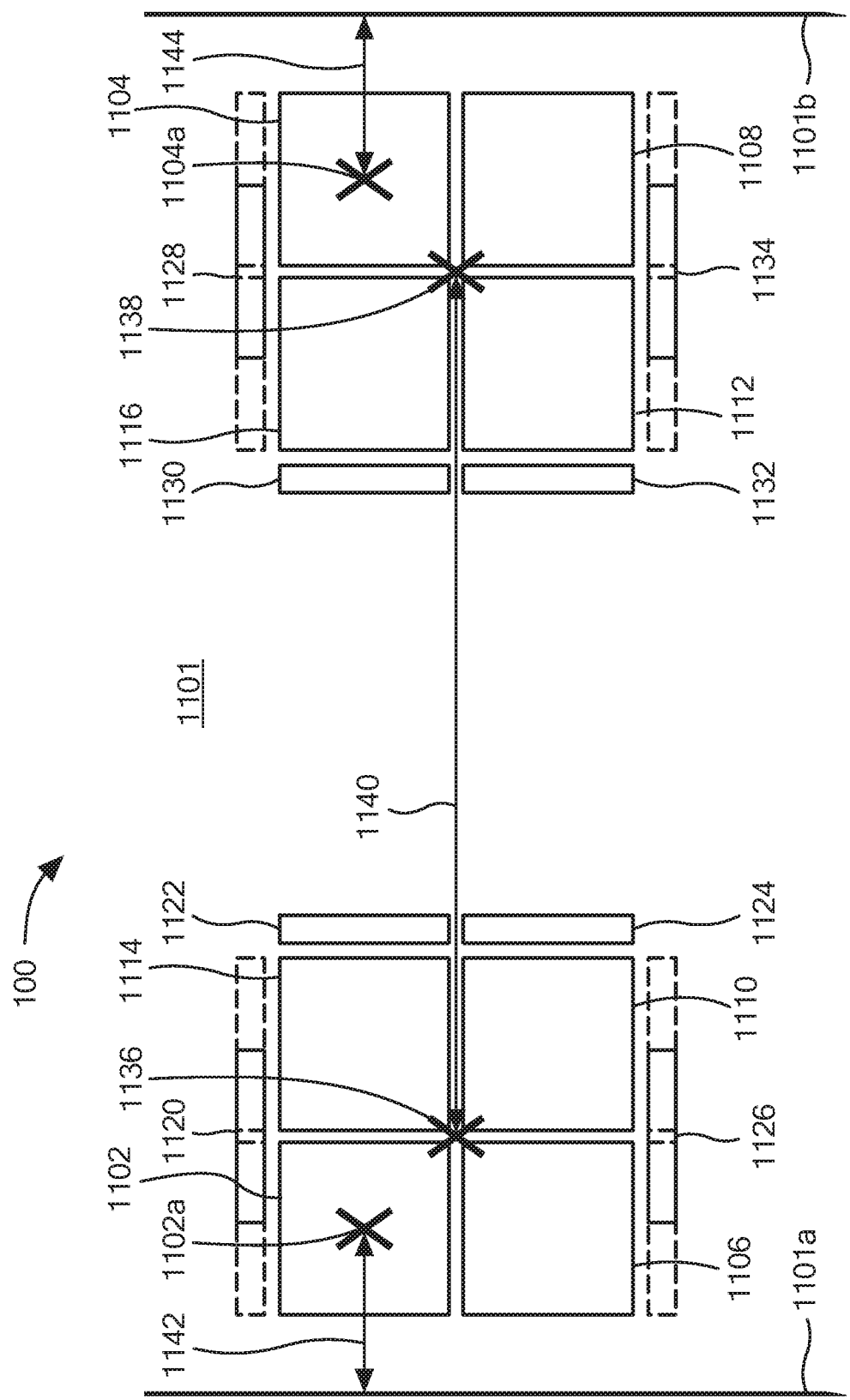
FIG. 11 is a block diagram showing a top view of another illustrative substrate having eight Hall effect elements and eight vertical epi resistors.

Referring now to FIG. 11, an electronic circuit 1100 can include first and second Hall effect elements 1102, 1104, respectively, disposed upon, within, or over a substrate 1101. The substrate 1101 can have first and second edges 1101a, 1101b, respectively. The first Hall effect element 1102 can have a geometric center 1102a proximate to the first edge 1101a and the second Hall effect element 1104 can have a geometric center 1104a proximate to the second edge 1101b.

The geometric center 1102a can be a distance 1142 from the first edge 1101a and the geometric center 1104a can be a distance 1144 from the second edge 1101b.

The electronic circuit 1100 can also include third, fourth, fifth, sixth, seventh, and eighth Hall effect elements 1106, 1108, 1110, 1112, 1114, 1116 respectively, disposed upon, within, or over the substrate 1101. The third Hall effect element 1106 can be disposed proximate to the first Hall effect element 1102, the fourth Hall effect element 1108 can be disposed proximate to the second Hall effect element 1104, the fifth Hall effect element 1110 can be disposed proximate to the third Hall effect element 1106, the sixth Hall effect element 1112 can be disposed proximate to the fourth Hall effect element 1108, the seventh Hall effect element 1114 can be disposed proximate to the fifth Hall effect element 1110, and the eighth Hall effect element 1116 can be disposed proximate to the sixth Hall effect element 1112.

The first, third, fifth, and seventh Hall effect elements 1102, 1106, 1110, 1114, respectively, taken together have a geometric center 1136. The second, fourth, sixth, and eighth Hall effect elements 1104, 1108, 1112, 1116, respectively, taken together, have a geometric center 1138. A distance 1140 can be the same as or similar to the distance 608 of FIG. 6.

In some embodiments, the first, third, fifth, and seventh Hall effect element 1102, 1106, 1110, 1114 can be coupled together in a rectangular arrangement in series or in parallel, forming a first effective Hall effect element (i.e., having one differential output). In some embodiments, the second, fourth, sixth, and eighth Hall effect elements 1104, 1108, 1112, 1116 can be coupled together in a rectangular arrangement in series or in parallel, forming a second effective Hall effect element (i.e., having one differential output).

The electronic circuit 1100 can also include first and second vertical epi resistors 1120, 1128, respectively, positioned as shown, which can be proximate to the first and second Hall effect elements 1102, 1104, respectively. It should be understood that a distance between a geometric center of the first vertical epi resistor 1120 and the first edge 1101a is greater than or equal to the distance 1142. It should also be understood that a distance between a geometric center of the second vertical epi resistor 1128 and the second edge 1101b is greater than or equal to the distance 1144.

In some embodiments, the electronic circuit can also include third, fourth, fifth, sixth, seventh, and eighth vertical epi resistors 1122, 1130, 1124, 1132, 1126, 1134, respectively. Like the first and second vertical epi resistors 1120, 1128, the third, fourth, fifth, sixth, seventh, and eighth vertical epi resistors 1122, 1130, 1124, 1132, 1126, 1134 can have respective geometric centers each further from the edges 1101a, 1101b than the distances 1142, 1144.

In some embodiments, the first, third, fifth, and seventh vertical epi resistor 1120, 1122, 1124, 1126 can be coupled together in series or in parallel, forming a first effective vertical epi resistor (i.e., having two terminals). In some embodiments, the second, fourth, sixth, and eighth vertical epi resistors 1128, 1130, 1132, 1134 can be coupled together in series or in parallel, forming a second effective vertical epi resistor (i.e., having two terminals).

Examples of alternate positions of some of the eight vertical epi resistors are shown in dashed lines. Even at positions indicated by positions of the dashed lines, distances between geometric centers at the positions of the dashed lines and the edges 1101a, 1101b are greater than or equal to the distances 1142, 1144.

The first, third, fifth, and seventh Hall effect elements 1102, 1106, 1110, 1114, respectively, and the first, third, fifth, and seventh vertical epi resistors 1120, 1122, 1124, 1126, respectively, may be used in conjunction with a first current driver like any of the current driver arrangements of FIG. 1, 4, or 5. For these embodiments, the first, third, fifth, and seventh Hall effect elements 1102, 1106, 1110, 1114, respectively, may be coupled in series or in parallel and the first, third, fifth, and seventh vertical epi resistors 1120, 1122, 1124, 1126, respectively, may be coupled in series or in parallel.

Similarly, the second, fourth, sixth, and eighth Hall effect elements 1104, 1108, 1112, 1116, respectively, and the second, fourth, sixth, and eighth vertical epi resistors 1128, 1130, 1132, 1134, respectively, may be used in conjunction with a second current driver like any of the current driver arrangements of FIG. 1, 4, or 5. For these embodiments, the second, fourth, sixth, and eighth Hall effect elements 1104, 1108, 1112, 1116, respectively, may be coupled in series or in parallel and the second, fourth, sixth, and eighth vertical epi resistors 1128, 1130, 1132, 1134, respectively, may be coupled in series or in parallel.

In some embodiments, one of, or each one of, the eight vertical epi resistors can be coupled in series with or in parallel with other vertical epi resistors. In some embodiments, one of, or each one of, the eight Hall effect elements can be coupled in series with or in parallel with other Hall effect elements (not shown).

In some embodiments, not all of the eight vertical epi resistors are provided. For example, only the first and second vertical epi resistors 1120, 1128, respectively, or another pair, or two pairs, can be provided.

Figure 12:
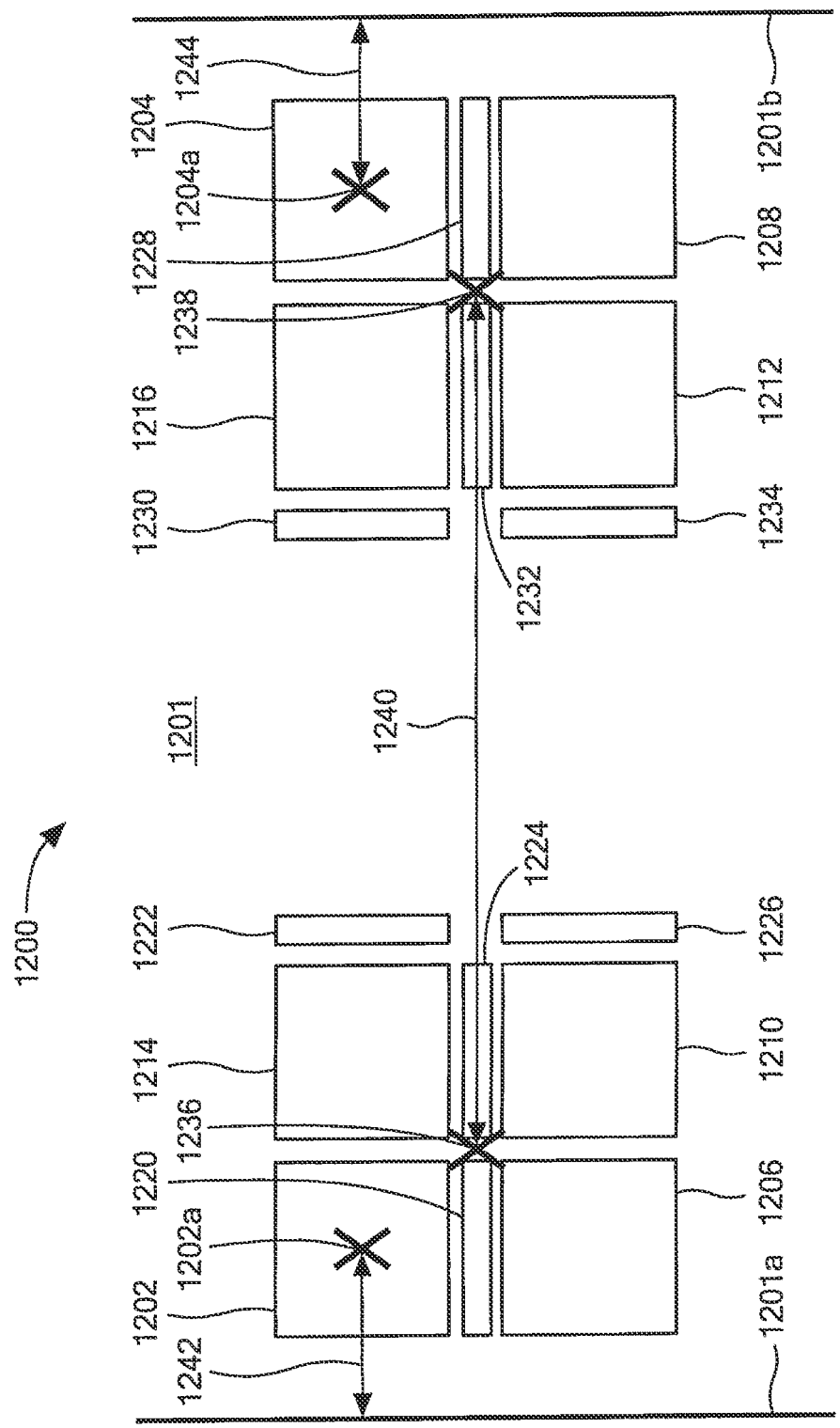
FIG. 12 is a block diagram showing a top view of another illustrative substrate having eight Hall effect elements and eight vertical epi resistors.

Referring now to FIG. 12, an electronic circuit 1200 can include first and second Hall effect elements 1202, 1204, respectively, disposed upon, within, or over a substrate 1201. The substrate 1201 can have first and second edges 1201a, 1201b, respectively. The first Hall effect element 1202 can have a geometric center 1202a proximate to the first edge 1201a, and the second Hall effect element 1204 can have a geometric center 1204a proximate to the second edge 1201b.

The geometric center 1202a can be a distance 1242 from the first edge 1201a and the geometric center 1204a can be a distance 1244 from the second edge 1201b.

The electronic circuit 1200 can also include third, fourth, fifth, sixth, seventh, and eighth Hall effect elements 1206, 1208, 12101212, 1214, 1216 respectively, disposed upon, within, or over the substrate 1201. The third Hall effect element 1206 can be disposed proximate to the first Hall effect element 1202, the fourth Hall effect element 1208 can be disposed proximate to the second Hall effect element 1204, the fifth Hall effect element 1210 can be disposed proximate to the third Hall effect element 1206, the sixth Hall effect element 1212 can be disposed proximate to the fourth Hall effect element 1208, the seventh Hall effect element 1214 can be disposed proximate to the fifth Hall effect element 1210, and the eighth Hall effect element 1216 can be disposed proximate to the sixth Hall effect element 1212.

The first, third, fifth, and seventh Hall effect elements 1202, 1206, 1210, 1214, respectively, taken together have a geometric center 1236. The second, fourth, sixth, and eighth Hall effect elements 1204, 1208, 1212, 1216, respectively, taken together, have a geometric center 1238. A distance 1240 can be the same as or similar to the distance 608 of FIG. 6.

In some embodiments, the first, third, fifth, and seventh Hall effect element 1202, 1206, 1210, 1214 can be coupled together in a rectangular arrangement in series or in parallel, forming a first effective Hall effect element (i.e., having one differential output). In some embodiments, the second, fourth, sixth, and eighth Hall effect elements 1204, 1208, 1212, 1216 can be coupled together in a rectangular arrangement in series or in parallel, forming a second effective Hall effect element (i.e., having one differential output).

The electronic circuit 1200 can also include first and second vertical epi resistors 1220, 1228, respectively, positioned as shown, which can be proximate to the first and second Hall effect elements 1202, 1204, respectively. It should be understood that a distance between a geometric center of the first vertical epi resistor 1220 and the first edge 1201a is greater than or equal to the distance 1242. It should also be understood that a distance between a geometric center of the second vertical epi resistor 1228 and the second edge 1201b is greater than or equal to the distance 1244.

In some embodiments, the electronic circuit can also include third, fourth, fifth, sixth, seventh, and eighth vertical epi resistors 1222, 1230, 1224, 1232, 1226, 1234, respectively. Like the first and second vertical epi resistors 1220, 1228, the third, fourth, fifth, sixth, seventh, and eighth vertical epi resistors 1222, 1230, 1224, 1232, 1226, 1234 can have respective geometric centers each further from the edges 1201a, 1201b than the distances 1242, 1244.

In some embodiments, the first, third, fifth, and seventh vertical epi resistor 1220, 1222, 1224, 1226 can be coupled together arrangement in series or in parallel, forming a first effective vertical epi resistor (i.e., have two terminals). In some embodiments, the second, fourth, sixth, and eighth vertical epi resistors 1228, 1230, 1232, 1234 can be coupled together in series or in parallel, forming a second effective vertical epi resistor (i.e., having two terminals).

Examples of alternate positions of some of the eight vertical epi resistors are shown in dashed lines. Even at positions indicated by positions of the dashed lines, distances between geometric centers at the positions of the dashed lines and the edges 1201a, 1201b are greater than or equal to the distances 1242, 1244, respectively.

The first, third, fifth, and seventh Hall effect elements 1202, 1206, 1210, 1214, respectively, and the first, third, fifth, and seventh vertical epi resistors 1220, 1222, 1224, 1226, respectively, may be used in conjunction with a first current driver like any of the current driver arrangements of FIG. 1, 4, or 5. For these embodiments, the first, third, fifth, and seventh Hall effect elements 1202, 1206, 1210, 1214, respectively, may be coupled in series or in parallel and the first, third, fifth, and seventh vertical epi resistors 1220, 1222, 1224, 1226, respectively, may be coupled in series or in parallel.

Similarly, the second, fourth, sixth, and eighth Hall effect elements 1204, 1208, 1212, 1216, respectively, and the second, fourth, sixth, and eighth vertical epi resistors 1228, 1230, 1232, 1234, respectively, may be used in conjunction with a second current driver like any of the current driver arrangements of FIG. 1, 4, or 5. For these embodiments, the second, fourth, sixth, and eighth Hall effect elements 1204, 1208, 1212, 1216, respectively, may be coupled in series or in parallel and the second, fourth, sixth, and eighth vertical epi resistors 1228, 1230, 1232, 1234, respectively, may be coupled in series or in parallel.

In some embodiments, one of, or each one of, the eight vertical epi resistors can be coupled in series with or in parallel with other vertical epi resistors (not shown). In some embodiments, one of, or each one of, the eight Hall effect elements can be coupled in series with, or in parallel with, other Hall effect elements (not shown).

In some embodiments, not all of the eight vertical epi resistors are provided. For example, only the first and second vertical epi resistors 1220, 1228, respectively, or another pair, or two pairs, can be provided.

Figure 13:
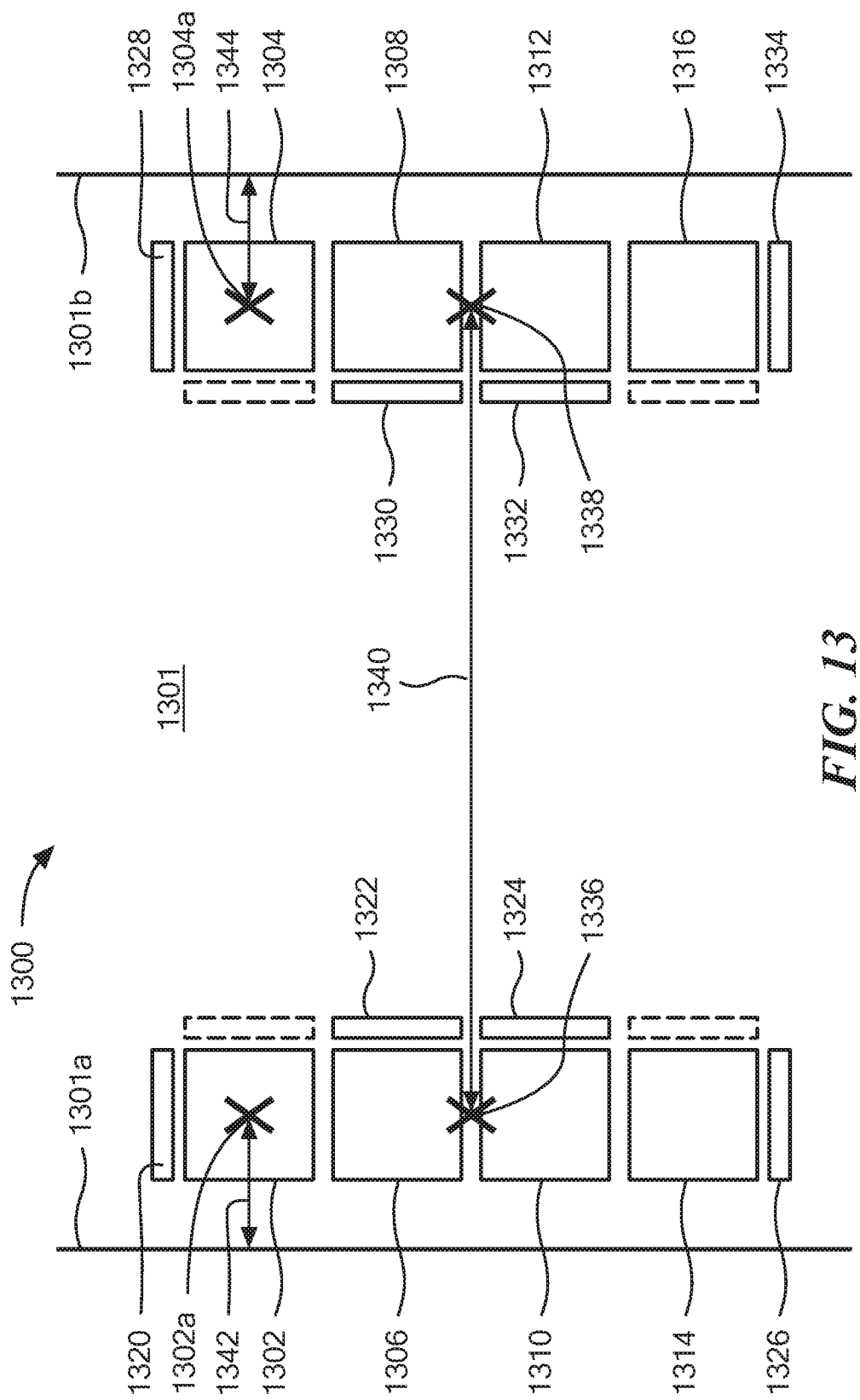
FIG. 13 is a block diagram showing a top view of another illustrative substrate having eight Hall effect elements and eight vertical epi resistors.

Referring now to FIG. 13, an electronic circuit 1300 can include first and second Hall effect elements 1302, 1304, respectively, disposed upon, within, or over a substrate 1301. The substrate 1301 can have first and second edges 1301a, 1301b, respectively. The first Hall effect element 1302 can have a geometric center 1302a proximate to the first edge 1301a and the second Hall effect element 1304 can have a geometric center 1304a proximate to the second edge 1301b.

The geometric center 1302a can be a distance 1342 from the first edge 1301a and the geometric center 1304a can be a distance 1344 from the second edge 1301b.

The electronic circuit 1300 can also include third, fourth, fifth, sixth, seventh, and eighth Hall effect elements 1306, 1308, 1310, 1312, 1314, 1316, respectively, disposed upon, within, or over the substrate 1301. The third Hall effect element 1306 can be disposed proximate to the first Hall effect element 1302, the fourth Hall effect element 1308 can be disposed proximate to the second Hall effect element 1304, the fifth Hall effect element 1310 can be disposed proximate to the third Hall effect element 1306, the sixth Hall effect element 1312 can be disposed proximate to the fourth Hall effect element 1308, the seventh Hall effect element 1314 can be disposed proximate to the fifth Hall effect element 1310, and the eighth Hall effect element 1316 can be disposed proximate to the sixth Hall effect element 1312.

The first, third, fifth, and seventh Hall effect elements 1302, 1306, 1310, 1314, respectively, taken together have a geometric center 1336. The second, fourth, sixth, and eighth Hall effect elements 1304, 1308, 1312, 1316, respectively, taken together, have a geometric center 1338. A distance 1340 can be the same as or similar to the distance 608 of FIG. 6.

Comparing the electronic circuit 1300 to, for example, the electronic circuit 1200, the distances 1340 and 1240 can be the same, but a distance between substrate edges 1301a, 1301b can be smaller than a distance between substrate edges 1201a and 1201b, due to the linear arrangement of the Hall effect elements of the electronic circuit 1300. Thus, the substrate 1301 can be smaller than the substrate 1201. As a result, the electronic circuit 1300 can be less expensive than the electronic circuit 1200.

In some embodiments, the first, third, fifth, and seventh Hall effect element 1302, 1306, 1310, 1314 can be coupled together in a linear arrangement in series or in parallel, forming a first effective Hall effect element (i.e., having one differential output). In some embodiments, the second, fourth, sixth, and eighth Hall effect elements 1304, 1308, 1312, 1316 can be coupled together in a linear arrangement in series or in parallel, forming a second effective Hall effect element (i.e., having one differential output).

The electronic circuit 1300 can also include first and second vertical epi resistors 1320, 1328, respectively, positioned as shown, which can be proximate to the first and second Hall effect elements 1302, 1304, respectively. It should be understood that a distance between a geometric center of the first vertical epi resistor 1320 and the first edge 1301a is greater than or equal to the distance 1342. It should also be understood that a distance between a geometric center of the second vertical epi resistor 1328 and the second edge 1301b is greater than or equal to the distance 1344.

In some embodiments, the electronic circuit can also include third, fourth, fifth, sixth, seventh, and eighth vertical epi resistors 1322, 1330, 1324, 1332, 1326, 1334, respectively. Like the first and second vertical epi resistors 1320, 1328, the third, fourth, fifth, sixth, seventh, and eighth vertical epi resistors 1322, 1330, 1324, 1332, 1326, 1334 can have respective geometric centers each further from the edges 1301*a*, 1301*b* than the distances 1342 or 1344, respectively.

In some embodiments, the first, third, fifth, and seventh vertical epi resistor 1320, 1322, 1324, 1326 can be coupled together in series or in parallel, forming a first effective vertical epi resistor (i.e., have two terminals). In some embodiments, the second, fourth, sixth, and eighth vertical epi resistors 1328, 1330, 1332, 1334 can be coupled together in series or in parallel, forming a second effective vertical epi resistor (i.e., having two terminals).

Examples of alternate positions of some of the eight vertical epi resistors are shown in dashed lines. Even at positions indicated by positions of the dashed lines, distances between geometric centers at the positions of the dashed lines and the edges 1301*a*, 1301*b* are greater than or equal to the distances 1342, 1344, respectively.

The first, third, fifth, and seventh Hall effect elements 1302, 1306, 1310, 1314, respectively, and the first, third, fifth, and seventh vertical epi resistors 1320, 1322, 1324, 1326, respectively may be used in conjunction with a first current driver like any of the current driver arrangements of FIG. 1, 4, or 5. For these embodiments, the first, third, fifth, and seventh Hall effect elements 1302, 1306, 1310, 1314, respectively, may be coupled in series or in parallel and the first, third, fifth, and seventh vertical epi resistors 1320, 1322, 1324, 1326, respectively, may be coupled in series or in parallel.

Similarly, the second, fourth, sixth, and eighth Hall effect elements 1304, 1308, 1312, 1316, respectively, and the second, fourth, sixth, and eighth vertical epi resistors 1328, 1330, 1332, 1334, respectively, may be used in conjunction with a second current driver like any of the current driver arrangements of FIG. 1, 4, or 5. For these embodiments, the second, fourth, sixth, and eighth Hall effect elements 1304, 1308, 1312, 1316, respectively, may be coupled in series or in parallel and the second, fourth, sixth, and eighth vertical epi resistors 1328, 1330, 1332, 1334, respectively, may be coupled in series or in parallel.

In some embodiments, one of, or each one of, the eight vertical epi resistors can be coupled in series with or in parallel with other vertical epi resistors. In some embodiments, one of, or each one of, the eight Hall effect elements can be coupled in series with or in parallel with other Hall effect elements (not shown).

In some embodiments, not all of the eight vertical epi resistors are provided. For example, only the first and second vertical epi resistors 1320, 1328, respectively, or another pair, or two pairs, can be provided.

Figure 14:
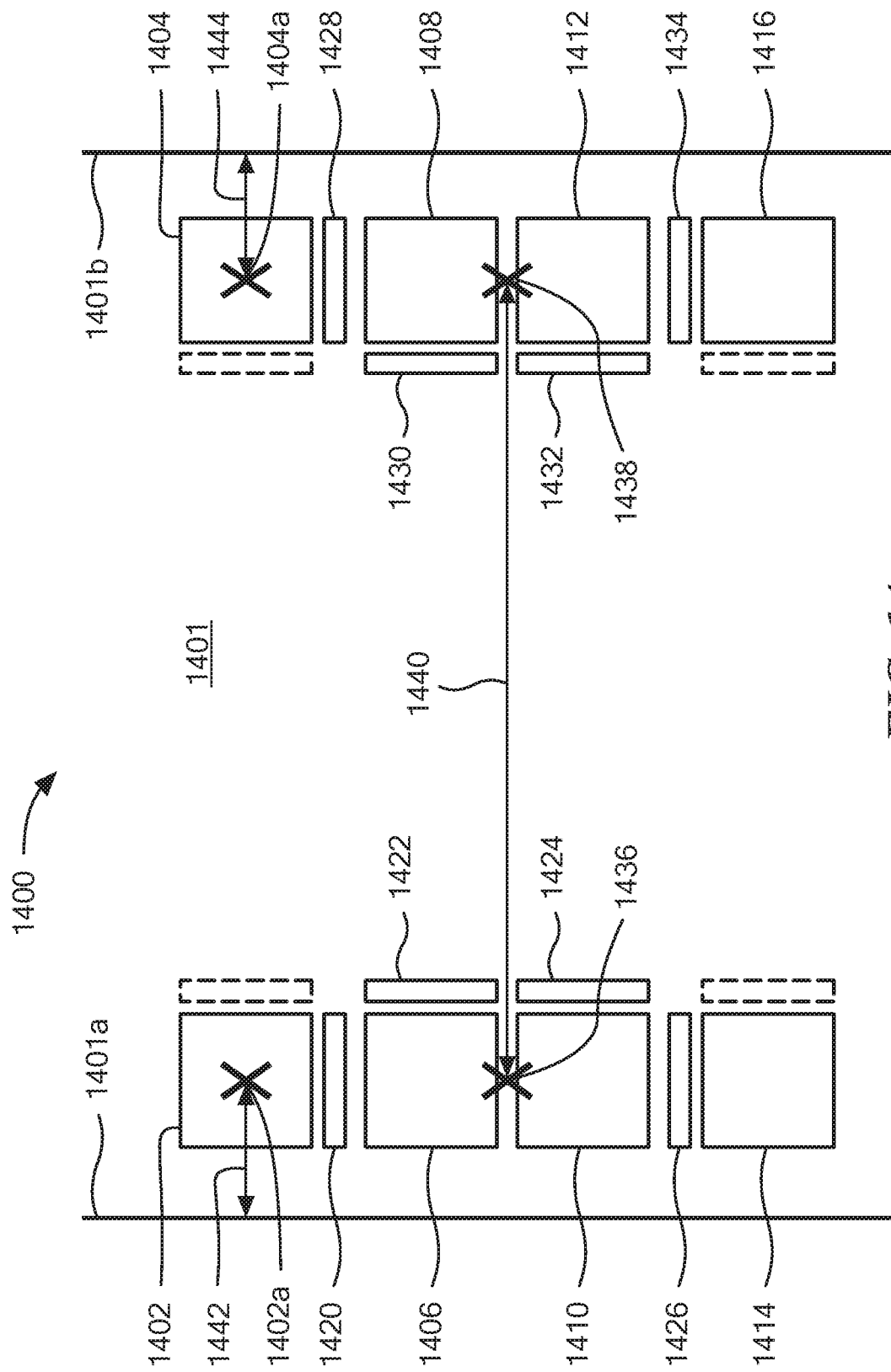
FIG. 14 is a block diagram showing a top view of another illustrative substrate having eight Hall effect elements and eight vertical epi resistors.

Referring now to FIG. 14, an electronic circuit 1400 can include first and second Hall effect elements 1402, 1404, respectively, disposed upon, within, or over a substrate 1401. The substrate 1401 can have first and second edges 1401*a*, 1401*b*, respectively. The first Hall effect element 1402 can have a geometric center 1402*a* proximate to the first edge 1401*a*, and the second Hall effect element 1404 can have a geometric center 1404*a* proximate to the second edge 1401*b*.

The geometric center 1402*a* can be a distance 1442 from the first edge 1401*a* and the geometric center 1404*a* can be a distance 1444 from the second edge 1401*b*.

The electronic circuit 1400 can also include third, fourth, fifth, sixth, seventh, and eighth Hall effect elements 1406, 1408, 1410, 1412, 1414, 1416 respectively, disposed upon, within, or over the substrate 1401. The third Hall effect element 1406 can be disposed proximate to the first Hall effect element 1402, the fourth Hall effect element 1408 can be disposed proximate to the second Hall effect element 1404, the fifth Hall effect element 1410 can be disposed proximate to the third Hall effect element 1406, the sixth Hall effect element 1412 can be disposed proximate to the fourth Hall effect element 1408, the seventh Hall effect element 1414 can be disposed proximate to the fifth Hall effect element 1410, and the eighth Hall effect element 1416 can be disposed proximate to the sixth Hall effect element 1412.

The first, third, fifth, and seventh Hall effect elements 1402, 1406, 1410, 1414, respectively, taken together have a geometric center 1434. The second, fourth, sixth, and eighth Hall effect elements 1404, 1408, 1412, 1416, respectively, taken together, have a geometric center 1436. A distance 1438 can be the same as or similar to the distance 608 of FIG. 6.

In some embodiments, the first, third, fifth, and seventh Hall effect element 1402, 1406, 1410, 1414 can be coupled together in a linear arrangement in series or in parallel, forming a first effective Hall effect element (i.e., having one differential output). In some embodiments, the second, fourth, sixth, and eighth Hall effect elements 1404, 1408, 1412, 1416 can be coupled together in a linear arrangement in series or in parallel, forming a second effective Hall effect element (i.e., having one differential output).

The electronic circuit 1400 can also include first and second vertical epi resistors 1420, 1428, respectively, positioned as shown proximate to the first and second Hall effect elements 1402, 1404, respectively. It should be understood that a distance between a geometric center of the first vertical epi resistor 1420 and the first edge 1401*a* is greater than or equal to the distance 1442. It should also be understood that a distance between a geometric center of the second vertical epi resistor 1428 and the second edge 1401*b* is greater than or equal to the distance 1444.

In some embodiments, the electronic circuit can also include third, fourth, fifth, sixth, seventh, and eighth vertical epi resistors 1422, 1430, 1424, 1432, 1426, 1434, respectively. Like the first and second vertical epi resistors 1420, 1428, the third, fourth, fifth, sixth, seventh, and eighth vertical epi resistors 1422, 1430, 1424, 1432, 1426, 1434 can have respective geometric centers each further from the edges 1401*a*, 1401*b* than the distances 1442, 1444.

In some embodiments, the first, third, fifth, and seventh vertical epi resistor 1420, 1422, 1424, 1426 can be coupled together in series or in parallel, forming a first effective vertical epi resistor (i.e., have two terminals). In some embodiments, the second, fourth, sixth, and eighth vertical epi resistors 1428, 1430, 1432, 1434 can be coupled together in series or in parallel, forming a second effective vertical epi resistor (i.e., having two terminals).

Examples of alternate positions of some of the eight vertical epi resistors are shown in dashed lines. Even at positions indicated by positions of the dashed lines, distances between geometric centers at the positions of the dashed lines and the edges 1401*a*, 1401*b* are greater than or equal to the distances 1442, 1444, respectively.

The first, third, fifth, and seventh Hall effect elements 1402, 1406, respectively, and the first, third, fifth, and seventh vertical epi resistors 1420, 1422, 1424, 1426, respectively may be used in conjunction with a first current driver like any of the current driver arrangements of FIG. 1, 4, or 5. For these embodiments, the first, third, fifth, and seventh Hall effect elements 1402, 1406, 1412, 1414, respectively, may be coupled in series or in parallel and the first, third, fifth, and seventh vertical epi resistors 1420, 1422, 1424, 1426, respectively, may be coupled in series or in parallel.

Similarly, the second, fourth, sixth, and eighth Hall effect elements 1404, 1408, 1412, 1416, respectively, and the second, fourth, sixth, and eighth vertical epi resistors 1428, 1430, 1432, 1434, respectively, may be used in conjunction with a second current driver like any of the current driver arrangements of FIG. 1, 4, or 5. For these embodiments, the second, fourth, sixth, and eighth Hall effect elements 1404, 1408, 1412, 1416, respectively, may be coupled in series or in parallel and the second, fourth, sixth, and eighth vertical epi resistors 1428, 1430, 1432, 1434, respectively, may be coupled in series or in parallel.

In some embodiments, one of, or each one of, the eight vertical epi resistors can be coupled in series with or in parallel with other vertical epi resistors. In some embodiments, one of, or each one of, the eight Hall effect elements can be coupled in series with or in parallel with other Hall effect elements (not shown).

In some embodiments, not all of the eight vertical epi resistors are provided. For example, only the first and second vertical epi resistors 1420, 1428, respectively, or another pair, or two pairs, can be provided.

Figure 15:
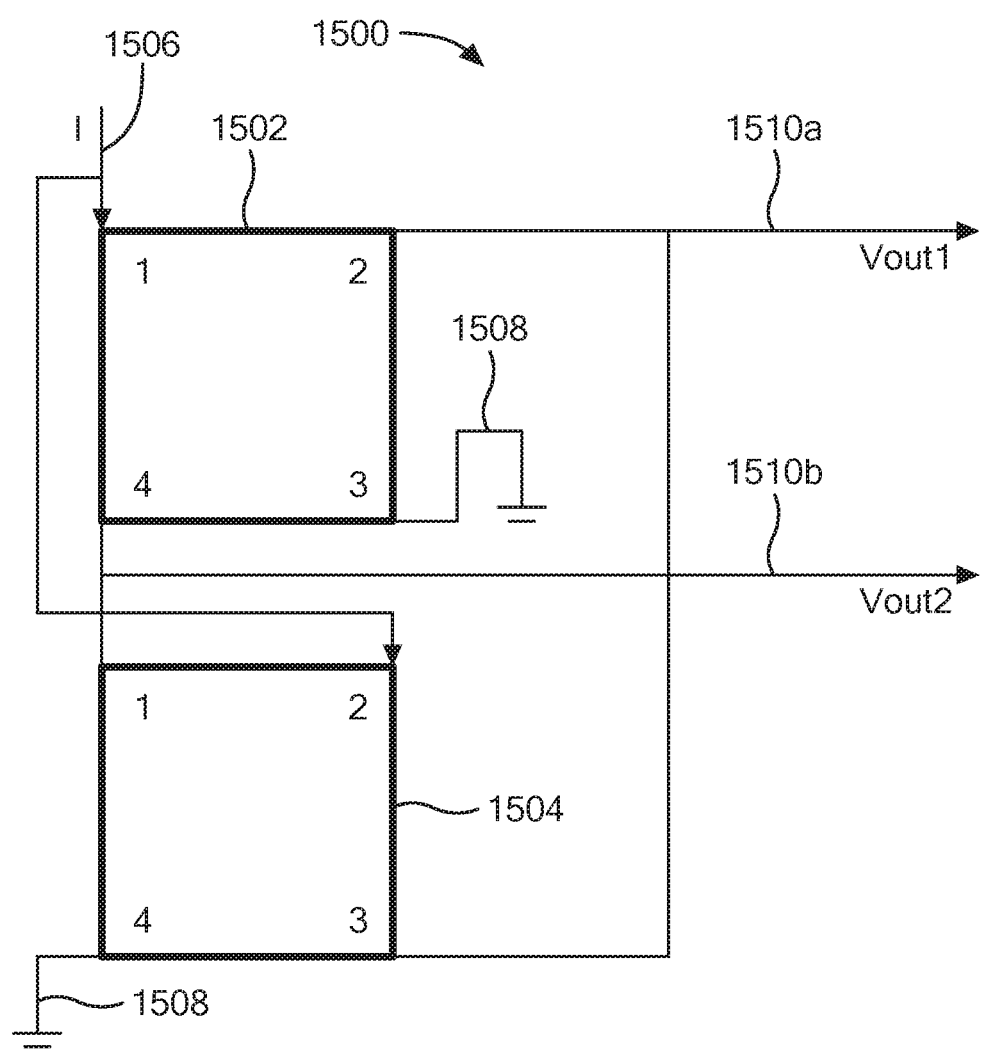
FIG. 15 is a circuit diagram showing a parallel coupling of two vertical Hall effect elements, which can be the same as or similar to a pair of the four Hall effect elements of FIG. 8 or 9.

Referring now to FIG. 15, a part 1500 of an associated electronic circuit can include first and second Hall effect elements 1502, 1504, respectively. The first and second Hall effect elements can be coupled together in parallel to generate one differential output signal 1510a, 1510b.

The first and second Hall effect elements 1502, 1504 can be driven with one current source for generating a current I 1506. The first and second Hall effect elements 1502, 1504 can also be coupled to ground 1508, or alternatively, to some other voltage reference.

Thus, the first and second Hall effect elements 1502, 1504 act as one effective Hall effect element with two output nodes, one driven node, and one reference node, i.e., four nodes.

Current spinning is a known techniques used with Hall effect element, in which coupling to four Hall effect element nodes are periodically changed in such that the two output nodes, one driven node, and one reference node rotate around the four nodes. The current spinning tends to reduce (or average) an effect of an undesirable DC offset voltage that occurs at each one of the changes of the periodically changing couplings.

It should be apparent that first Hall effect element 1502 can be differently coupled than the second Hall effect element 1504, such that the driven node (node 1) of the first Hall effect element 1502 is different than the driven node (node 2) of the second Hall effect element. Other nodes can also be differently coupled. Statically, with no current spinning, this arrangement tends to reduce a DC offset voltage. However, with the arrangement shown, still current spinning can be used. For example, the driven nodes can be 1 and 2 at one time, 2 and 3 at another time, 3 and 4 at another time, and 4 and 1 at another time, and the other couplings can rotate around the Hall effect elements in a similar fashion.

The couplings of the part 1500 of the associated electronic circuit can be used, for example, for each of the two pairs of Hall effect elements of the electronic circuits of FIGS. 8 and 9.

Series couplings are also possible.

Figure 16:
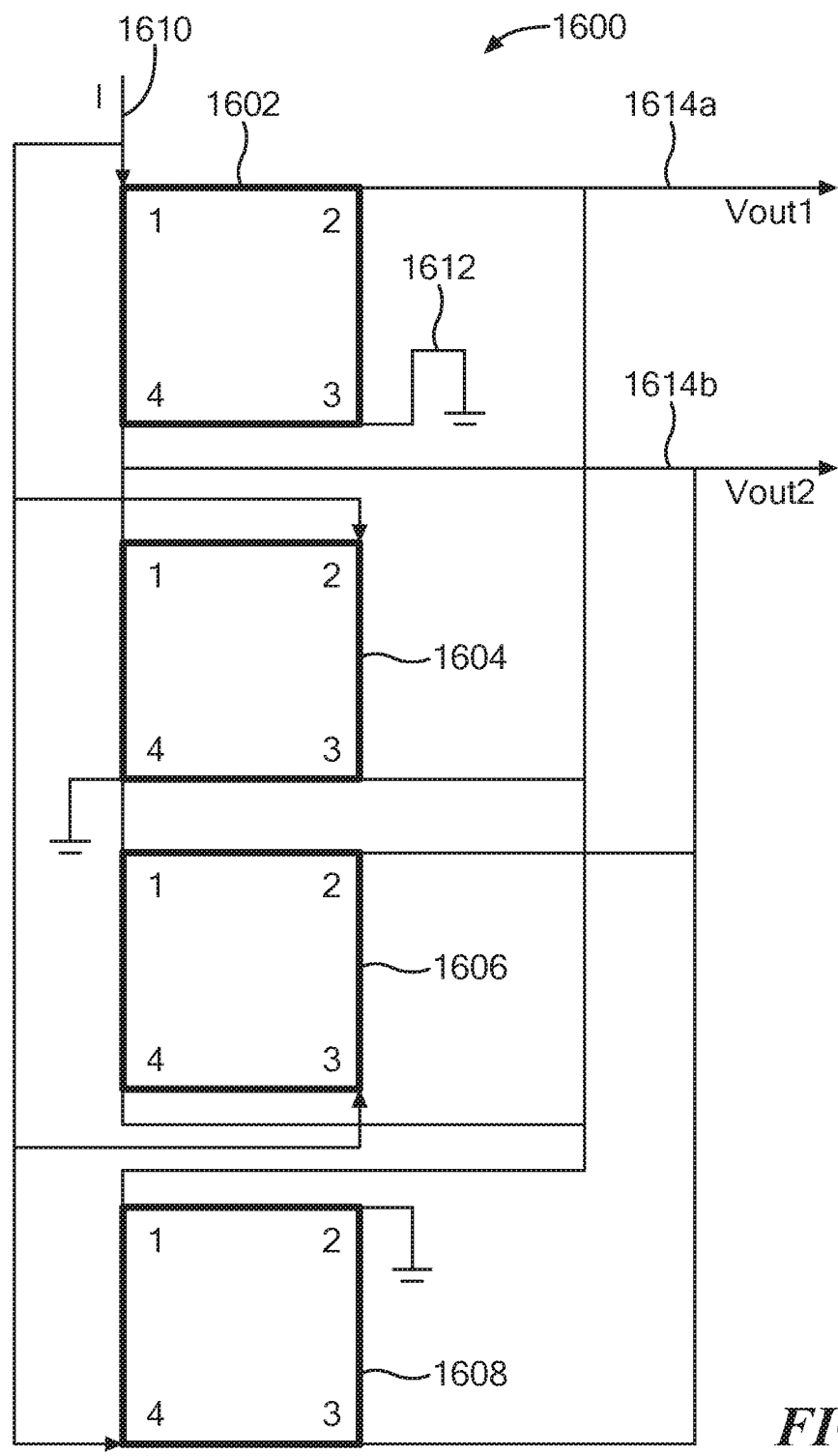
FIG. 16 is a circuit diagram showing a parallel coupling of four vertical Hall effect elements, which can be the same as or similar to a rectangular or linear group of the eight Hall effect elements of FIGS. 10, 11, 12, 13, of 14.

Referring now to FIG. 16, a part 1600 of an associated electronic circuit can include first, second, third, and fourth Hall effect elements 1602, 1604, 1606, 1608, respectively. The first, second, third, and fourth Hall effect elements 1602, 1604, 1606, 1608 can be coupled together in parallel to generate one differential output signal 1614a, 1614b.

The first, second, third, and fourth Hall effect elements 1602, 1604, 1606, 1608 can be driven with one current source for generating a current I 1610. The first, second, third, and fourth Hall effect elements 1602, 1604, 1606, 1608 can also be coupled to ground 1612, or alternatively, to some other voltage reference.

Thus, the first, second, third, and fourth Hall effect elements 1602, 1604, 1606, 1608 act as one effective Hall effect element with two output nodes, one driven node, and one reference node, i.e., four nodes.

It should be apparent the four Hall effect elements can be different coupled, such that the driven node of the first Hall effect element 1602 can be node, the driven node of the second Hall effect element 1604 can be node 2, the driven node of the third Hall effect element 1606 can be node 2, the driven node of the fourth Hall effect element 1608 can be node 2. Other nodes can also be differently coupled. Statically, with no current spinning, this arrangement tends to reduce a DC offset voltage. However, with the arrangement shown, still current spinning can be used.

The couplings of the part 1600 of the associate electronic circuit can be used, for example, for each of the two quad groups of Hall effect elements of the electronic circuits of FIGS. 10-14.

Series couplings are also possible.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:
1. An electronic circuit, comprising:
a semiconductor substrate having a surface, the surface of the semiconductor substrate having a width dimension;
an epitaxial layer disposed over the surface of the semiconductor substrate, the epitaxial layer having a first surface distal from the semiconductor substrate and a second surface proximate to the semiconductor substrate;
a first Hall effect element disposed in the epitaxial layer, wherein the first Hall effect element has a geometric center in a plane of the surface of the substrate;
a second Hall effect element disposed in the epitaxial layer, wherein the second Hall effect element has a geometric center in the plane of the surface of the substrate, wherein a line between the geometric centers of the first and second Hall effect element is parallel to the width dimension of the substrate, wherein the geometric center of the first Hall effect element has a first Hall effect element distance proximate to a first end of the width dimension and the geometric center of the second Hall effect element has a second Hall effect element distance proximate to a second end of the width dimension;
a first current generator configured to generate a first drive current that passes through the first Hall effect element, wherein the first current generator comprises:
   a first vertical epi resistor disposed in the epitaxial layer and proximate to the first Hall effect element, wherein the first vertical epi resistor has a geometric center, and wherein the geometric center of the first vertical epi resistor has a first vertical epi resistor distance to a first end of the width dimension greater than or equal to the first Hall effect element distance, the electronic circuit further comprising:
a second current generator configured to generate a second drive current that passes through the second Hall effect element, wherein the second current generator comprises:
   a second vertical epi resistor disposed in the epitaxial layer and proximate to the second Hall effect element, wherein the second vertical epi resistor has a geometric center, and wherein the geometric center of the second vertical epi resistor has a second vertical epi resistor distance to a second end of the width dimension greater than or equal to the second Hall effect element distance.

2. The electronic circuit of claim 1, wherein the first and second vertical epi resistors each comprise:
   respective first and second pickups implanted upon and diffused into the first surface of the epitaxial layer; and
   a respective buried structure disposed under the first surface of the epitaxial layer and under the respective first and second pickups, wherein the respective buried structure has a density of atoms that results in a low resistance path with a first resistance lower than a resistance of the epitaxial layer, wherein the first and second reference currents pass respectively from the respective first pickup, through a respective first region of the epitaxial layer, through the respective buried structure, and through a respective second region of the epitaxial layer to the respective second pickup.

3. The electronic circuit of claim 1, further comprising:
a first one or more additional vertical epi resistors coupled in series with or in parallel with the first vertical epi resistor, each having a respective geometric center, each respective geometric center of the first one or more additional vertical epi resistors having a respective vertical epi resistor distance to the first end of the width dimension greater than or equal to the first Hall effect element distance; and
a second one or more additional vertical epi resistors coupled in series with or in parallel with the second vertical epi resistor, each having a respective geometric center, each respective geometric center of the second one or more additional vertical epi resistors having a respective vertical epi resistor distance to the second end of the width dimension greater than or equal to the second Hall effect element distance.

4. The electronic circuit of claim 3, wherein the first and second vertical epi resistors and the first and second one or more additional vertical epi resistors each comprise:
   respective first and second pickups implanted upon and diffused into the first surface of the epitaxial layer; and
   a respective buried structure disposed under the first surface of the epitaxial layer and under the respective first and second pickups, wherein the respective buried structure has a density of atoms that results in a low resistance path with a first resistance lower than a resistance of the epitaxial layer, wherein the first and second reference currents pass respectively from the respective first pickup, through a respective first region of the epitaxial layer, through the respective buried structure, and through a respective second region of the epitaxial layer to the respective second pickup.

5. The electronic circuit of claim 1, wherein the first vertical epi resistor is operable to receive a first reference voltage resulting in a first reference current passing through the first vertical epi resistor, the first reference current related to the first drive current, wherein a resistance of the first vertical epi resistor, the first reference current, and the first drive current change in accordance with changes of a stress in the semiconductor substrate proximate to the first Hall effect element, and wherein the second vertical epi resistor is operable to receive a second reference voltage resulting in a second reference current passing through the second vertical epi resistor, the second reference current related to the second drive current, wherein a resistance of the second vertical epi resistor, the second reference current, and the second drive current change in accordance with changes of a stress in the semiconductor substrate proximate to the second Hall effect element.

6. The electronic circuit of claim 1, further comprising:
   a third Hall effect element electrically coupled to the first Hall effect element and disposed proximate to the first Hall effect element; and
   a fourth Hall effect element electrically coupled to the second Hall effect element and disposed proximate to the second Hall effect element.

7. The electronic circuit of claim 6, further comprising:
   a first one or more additional vertical epi resistors coupled in series with or in parallel with the first vertical epi resistor, each having a respective geometric center, each respective geometric center of the first one or more additional vertical epi resistors having a respective vertical epi resistor distance to the first end of the width dimension greater than or equal to the first Hall effect element distance; and
   a second one or more additional vertical epi resistors coupled in series with or in parallel with the second vertical epi resistor, each having a respective geometric center, each respective geometric center of the second one or more additional vertical epi resistors having a respective vertical epi resistor distance to the second end of the width dimension greater than or equal to the second Hall effect element distance.

8. The electronic circuit of claim 7, wherein the first and second vertical epi resistors and the first and second one or more additional vertical epi resistors each comprise:
   respective first and second pickups implanted upon and diffused into the first surface of the epitaxial layer; and
   a respective buried structure disposed under the first surface of the epitaxial layer and under the respective first and second pickups, wherein the respective buried structure has a density of atoms that results in a low resistance path with a first resistance lower than a resistance of the epitaxial layer, wherein the first and second reference currents pass respectively from the respective first pickup, through a respective first region of the epitaxial layer, through the respective buried structure, and through a respective second region of the epitaxial layer to the respective second pickup.

9. The electronic circuit of claim 6, wherein all of first drive current passes through the first and third Hall effect elements and wherein all of the second drive current passes through the second and fourth Hall effect elements.

10. The electronic circuit of claim 6, wherein the first drive current splits between the first and third Hall effect elements and wherein the second drive current splits between the second and fourth Hall effect elements.

11. The electronic circuit of claim 6, further comprising:
a third current generator configured to generate a third drive current that passes through the third Hall effect element, wherein the first current generator comprises:
    a third vertical epi resistor disposed in the epitaxial layer and proximate to the third Hall effect element, wherein the third vertical epi resistor has a geometric center, and wherein the geometric center of the third vertical epi resistor has a third vertical epi resistor distance to the first end of the width dimension greater than or equal to the first Hall effect element distance; and
a fourth current generator configured to generate a fourth drive current that passes through the fourth Hall effect element, wherein the fourth current generator comprises:
    a fourth vertical epi resistor disposed in the epitaxial layer and proximate to the fourth Hall effect element, wherein the fourth vertical epi resistor has a geometric center, and wherein the geometric center of the fourth vertical epi resistor has a fourth vertical epi resistor distance to the second end of the width dimension greater than or equal to the second Hall effect element distance.

12. The electronic circuit of claim 1, further comprising:
a third Hall effect element electrically coupled to the first Hall effect element and disposed proximate to the first Hall effect element; and
a fourth Hall effect element electrically coupled to the third Hall effect element and disposed proximate to the third Hall effect element
a fifth Hall effect element electrically coupled to the fourth Hall effect element and disposed proximate to the fourth Hall effect element; and
a sixth Hall effect element electrically coupled to the second Hall effect element and disposed proximate to the second Hall effect element
a seventh Hall effect element electrically coupled to the sixth Hall effect element and disposed proximate to the sixth Hall effect element; and
an eighth Hall effect element electrically coupled to the seventh Hall effect element and disposed proximate to the seventh Hall effect element.

13. The electronic circuit of claim 12, further comprising:
a first one or more additional vertical epi resistors coupled in series with or in parallel with the first vertical epi resistor, each having a respective geometric center, each respective geometric center of the first one or more additional vertical epi resistors having a respective vertical epi resistor distance to the first end of the width dimension greater than or equal to the first Hall effect element distance; and
a second one or more additional vertical epi resistors coupled in series with or in parallel with the second vertical epi resistor, each having a respective geometric center, each respective geometric center of the second one or more additional vertical epi resistors having a respective vertical epi resistor distance to the second end of the width dimension greater than or equal to the second Hall effect element distance.

14. The electronic circuit of claim 13, wherein the first and second vertical epi resistors and the first and second one or more additional vertical epi resistors each comprise:
respective first and second pickups implanted upon and diffused into the first surface of the epitaxial layer; and
a respective buried structure disposed under the first surface of the epitaxial layer and under the respective first and second pickups, wherein the respective buried structure has a density of atoms that results in a low resistance path with a first resistance lower than a resistance of the epitaxial layer, wherein the first and second reference currents pass respectively from the respective first pickup, through a respective first region of the epitaxial layer, through the respective buried structure, and through a respective second region of the epitaxial layer to the respective second pickup.

15. The electronic circuit of claim 12, wherein all of first drive current passes through the first, third, fourth, and fifth Hall effect elements and wherein all of the second drive current passes through the second, sixth, seventh, and eighth Hall effect elements.

16. The electronic circuit of claim 12, wherein the first drive current splits between the first, third, fourth, and fifth Hall effect elements and wherein the second drive current splits between the second, sixth, seventh, and eighth Hall effect elements.

17. The electronic circuit of claim 12, wherein the first, third, fourth, and fifth Hall effect elements are arranged in a line proximate to the first end of the width dimension of the substrate, and wherein the second, sixth, seventh and eighth Hall effect elements are arranged in a line proximate to and perpendicular to the second end of the width dimension of the substrate.

18. The electronic circuit of claim 12, wherein the first, third, fourth, and fifth Hall effect elements are arranged in a rectangular arrangement proximate to the first end of the width dimension of the substrate and distal from the second end, and wherein the second, sixth, seventh and eighth Hall effect elements are arranged in a rectangular arrangement proximate to and perpendicular to the second end of the width dimension of the substrate and distal from the first end.

19. The electronic circuit of claim 12, further comprising:
a third current generator configured to generate a third drive current that passes through the third Hall effect element, wherein the first current generator comprises:
    a third vertical epi resistor disposed in the epitaxial layer and proximate to the third Hall effect element, wherein the third vertical epi resistor has a geometric center, and wherein the geometric center of the third vertical epi resistor has a third vertical epi resistor distance to the first end of the width dimension greater than or equal to the first Hall effect element distance;
a fourth current generator configured to generate a fourth drive current that passes through the fourth Hall effect element, wherein the fourth current generator comprises:
    a fourth vertical epi resistor disposed in the epitaxial layer and proximate to the fourth Hall effect element, wherein the fourth vertical epi resistor has a geometric center, and wherein the geometric center of the fourth vertical epi resistor has a fourth vertical epi resistor distance to the first end of the width dimension greater than or equal to the first Hall effect element distance;

a fifth current generator configured to generate a fifth drive current that passes through the fifth Hall effect element, wherein the first current generator comprises:
    a fifth vertical epi resistor disposed in the epitaxial layer and proximate to the fifth Hall effect element, wherein the fifth vertical epi resistor has a geometric center, and wherein the geometric center of the fifth vertical epi resistor has a fifth vertical epi resistor distance to the first end of the width dimension greater than or equal to the first Hall effect element distance;
a sixth current generator configured to generate a sixth drive current that passes through the sixth Hall effect element, wherein the sixth current generator comprises:
    a sixth vertical epi resistor disposed in the epitaxial layer and proximate to the sixth Hall effect element, wherein the sixth vertical epi resistor has a geometric center, and wherein the geometric center of the sixth vertical epi resistor has a sixth vertical epi resistor distance to the second end of the width dimension greater than or equal to the second Hall effect element distance;
a seventh current generator configured to generate a seventh drive current that passes through the seventh Hall effect element, wherein the first current generator comprises:
    a seventh vertical epi resistor disposed in the epitaxial layer and proximate to the seventh Hall effect element, wherein the seventh vertical epi resistor has a geometric center, and wherein the geometric center of the seventh vertical epi resistor has a seventh vertical epi resistor distance to the second end of the width dimension greater than or equal to the second Hall effect element distance; and
an eighth current generator configured to generate an eighth drive current that passes through the eighth Hall effect element, wherein the eighth current generator comprises:
    an eighth vertical epi resistor disposed in the epitaxial layer and proximate to the eighth Hall effect element, wherein the eighth vertical epi resistor has a geometric center, and wherein the geometric center of the eighth vertical epi resistor has an eighth vertical epi resistor distance to the second end of the width dimension greater than or equal to the second Hall effect element distance.

20. A method of biasing a plurality of Hall effect elements, comprising:
    generating a first reference current by generating a first voltage reference across a first vertical epi resistor disposed in an epitaxial layer over a semiconductor substrate, the epitaxial layer having a first surface distal from the semiconductor substrate and a second surface proximate to the semiconductor substrate;
    injecting a first drive current into a first Hall effect element, wherein the first Hall effect element is disposed over the semiconductor substrate, wherein the first drive current is related to the first reference current, wherein a resistance of the first vertical epi resistor, the first reference current, and the first drive current change in accordance with changes of a stress in the semiconductor substrate;
    generating a second reference current by generating a second voltage reference across a second vertical epi resistor disposed in an epitaxial layer over a semiconductor substrate, the epitaxial layer having a second surface distal from the semiconductor substrate and a second surface proximate to the semiconductor substrate;
    injecting a second drive current into a second Hall effect element, wherein the second Hall effect element is disposed over the semiconductor substrate, wherein the second drive current is related to the second reference current, wherein a resistance of the second vertical epi resistor, the second reference current, and the second drive current change in accordance with changes of a stress in the semiconductor substrate, wherein the first Hall effect element has a geometric center in a plane of the surface of the substrate, wherein the second Hall effect element has a geometric center in the plane of the surface of the substrate, wherein a line between the geometric centers of the first and second Hall effect element is parallel to the width dimension of the substrate, wherein the geometric center of the first Hall effect element has a first Hall effect element distance proximate to a first end of the width dimension and the geometric center of the second Hall effect element has a second Hall effect element distance proximate to a second end of the width dimension, wherein the first vertical epi resistor has a geometric center, wherein the geometric center of the first vertical epi resistor has a first vertical epi resistor distance to a first end of the width dimension greater than or equal to the first Hall effect element distance, wherein the second vertical epi resistor has a geometric center, wherein the geometric center of the second vertical epi resistor has a second vertical epi resistor distance to a second end of the width dimension greater than or equal to the second Hall effect element distance.

21. An electronic circuit, comprising:
    means for generating a first reference current by generating a first voltage reference across a first vertical epi resistor disposed in an epitaxial layer over a semiconductor substrate, the epitaxial layer having a first surface distal from the semiconductor substrate and a second surface proximate to the semiconductor substrate;
    means for injecting a first drive current into a first Hall effect element, wherein the first Hall effect element is disposed over the semiconductor substrate, wherein the first drive current is related to the first reference current, wherein a resistance of the first vertical epi resistor, the first reference current, and the first drive current change in accordance with changes of a stress in the semiconductor substrate;
    means for generating a second reference current by generating a second voltage reference across a second vertical epi resistor disposed in an epitaxial layer over a semiconductor substrate, the epitaxial layer having a second surface distal from the semiconductor substrate and a second surface proximate to the semiconductor substrate;
    means for injecting a second drive current into a second Hall effect element, wherein the second Hall effect element is disposed over the semiconductor substrate, wherein the second drive current is related to the second reference current, wherein a resistance of the second vertical epi resistor, the second reference current, and the second drive current change in accordance with changes of a stress in the semiconductor substrate, wherein the first Hall effect element has a geometric center in a plane of the surface of the substrate, wherein the second Hall effect element has a geometric center in the plane of the surface of the substrate, wherein a line between the geometric centers of the first and second Hall effect element is parallel to the width dimension of the substrate, wherein the geometric center of the first Hall effect element has a first Hall effect element distance proximate to a first end of the width dimension and the geometric center of the second Hall effect element has a second Hall effect element distance proximate to a second end of the width dimension, wherein the first vertical epi resistor has a geometric center, wherein the geometric center of the first vertical epi resistor has a first vertical epi resistor distance to a first end of the width dimension greater than or equal to the first Hall effect element distance, wherein the second vertical epi resistor has a geometric center, wherein the geometric center of the second vertical epi resistor has a second vertical epi resistor distance to a second end of the width dimension greater than or equal to the second Hall effect element distance.

\* \* \* \* \*

UNITED STATES PATENT AND TRADEMARK OFFICE
CERTIFICATE OF CORRECTION

PATENT NO. : 10,520,559 B2
APPLICATION NO. : 15/676148
DATED : December 31, 2019
INVENTOR(S) : Juan Manuel Cesaretti et al.

Page 1 of 4

It is certified that error appears in the above-identified patent and that said Letters Patent is hereby corrected as shown below:

In the Specification

Column 1, Line 34, delete "related an" and replace with --related to an--.

Column 4, Line 38, delete "is block" and replace with --is a block--.

Column 5, Line 12, delete "FIG." and replace with --FIGS.--.

Column 5, Line 17, delete "13, of 14." and replace with --13, or 14.--.

Column 5, Line 22, delete "Hell" and replace with --Hall--.

Column 6, Line 21, delete "as" and replace with --is--.

Column 10, Line 11, delete "218, 222" and replace with --218, 220--.

Column 10, Line 16, delete "Now" and replace with --now--.

Column 10, Lines 38-39, delete "FIG. 1 FIG. 1" and replace with --FIG. 1--.

Column 10, Line 48, delete "described I" and replace with --described in--.

Column 10, Line 63, delete "PBL region" and replace with --PBL regions--.

Column 11, Line 28, delete "PBL region" and replace with --PBL regions--.

Column 11, Line 36, delete "element, 324." and replace with --element 324.--.

Column 13, Line 3, delete "408" and replace with --408.--.

Signed and Sealed this
Sixth Day of October, 2020

Andrei Iancu
*Director of the United States Patent and Trademark Office*

CERTIFICATE OF CORRECTION (continued)
U.S. Pat. No. 10,520,559 B2

Column 13, Line 41, delete "elements 118" and replace with --element 118--.

Column 14, Line 48, delete "on" and replace with --one--.

Column 14, Line 62, delete "gar" and replace with --gear--.

Column 15, Lines 7-8, delete "FIG. 1, 4, or 5." and replace with --FIGS. 1, 4, or 5.--.

Column 15, Lines 19-20, delete "FIG. 1, 4, or 5." and replace with --FIGS. 1, 4, or 5.--.

Column 15, Line 64, delete "arrangement," and replace with --arrangements,--.

Column 15, Line 65, delete "FIG. 1, 4, or 5." and replace with --FIGS. 1, 4, or 5.--.

Column 16, Line 32, delete "element 802, 806" and replace with --elements 802, 806--.

Column 16, Line 35, delete "element 804, 808" and replace with --elements 804, 808--.

Column 16, Line 52, delete "resistor 814, 816" and replace with --resistors 814, 816--.

Column 16, Line 54, delete "have" and replace with --having--.

Column 17, Lines 15-16, delete "FIG. 1, 4, or 5." and replace with --FIGS. 1, 4, or 5.--.

Column 17, Line 24, delete "FIG. 1, 4, or 5." and replace with --FIGS. 1, 4, or 5.--.

Column 17, Line 64, delete "circuit" and replace with --circuits--.

Column 18, Line 6, delete "element" and replace with --elements--.

Column 18, Line 26, delete "resistor" and replace with --resistors--.

Column 18, Line 28, delete "have" and replace with --having--.

Column 18, Lines 56-57, delete "FIG. 1, 4, or 5." and replace with --FIGS. 1, 4, or 5.--.

Column 18, Line 65, delete "FIG. 1, 4, or 5." and replace with --FIGS. 1, 4, or 5.--.

Column 19, Line 22, delete "1001b" and replace with --1001a--.

Column 19, Line 51, delete "element" and replace with --elements--.

Column 20, Line 12, delete "resistor" and replace with --resistors--.

Column 20, Line 14, delete "have" and replace with --having--.

CERTIFICATE OF CORRECTION (continued)
U.S. Pat. No. 10,520,559 B2

Column 20, Line 26, delete "FIG. 1, 4, or 5." and replace with --FIGS. 1, 4 or 5.--.

Column 20, Line 37, delete "FIG. 1, 4, or 5." and replace with --FIGS. 1, 4 or 5.--.

Column 21, Line 20, delete "element" and replace with --elements--.

Column 21, Line 47, delete "resistor" and replace with --resistors--.

Column 21, Line 65, delete "FIG. 1, 4, or 5." and replace with --FIGS. 1, 4 or 5.--.

Column 22, Line 9, delete "FIG. 1, 4, or 5." and replace with --FIGS. 1, 4 or 5.--.

Column 22, Line 39, delete "12101212," and replace with --1210, 1212,--.

Column 22, Line 60, delete "element" and replace with --elements--.

Column 23, Line 20, delete "resistor" and replace with --resistors--.

Column 23, Line 21, delete "together arrangement" and replace with --together in an arrangement--.

Column 23, Line 22, delete "have" and replace with --having--.

Column 23, Line 38, delete "FIG. 1, 4, or 5." and replace with --FIGS. 1, 4 or 5.--.

Column 24, Line 44, delete "element" and replace with --elements--.

Column 25, Line 4, delete "resistor" and replace with --resistors--.

Column 25, Line 7, delete "have" and replace with --having--.

Column 25, Line 23, delete "FIG. 1, 4, or 5." and replace with --FIGS. 1, 4 or 5.--.

Column 25, Line 34, delete "FIG. 1, 4, or 5." and replace with --FIGS. 1, 4 or 5.--.

Column 26, Line 12, delete "1434." and replace with --1436.--.

Column 26, Line 14, delete "1436." and replace with --1438.--.

Column 26, Line 15, delete "1438" and replace with --1440--.

Column 26, Line 19, delete "element" and replace with --elements--.

Column 26, Line 47, delete "resistor" and replace with --resistors--.

Column 26, Line 49, delete "have" and replace with --having--.

CERTIFICATE OF CORRECTION (continued)
U.S. Pat. No. 10,520,559 B2

Column 26, Lines 64-65, delete "FIG. 1, 4 or 5." and replace with --FIGS. 1, 4, or 5.--.

Column 27, Line 9, delete "FIG. 1, 4, or 5." and replace with --FIGS. 1, 4, or 5.--.

Column 27, Line 39, delete "techniques" and replace with --technique--.

Column 27, Line 40, delete "element," and replace with --elements,--.

Column 28, Line 14, delete "different coupled" and replace with --coupled differently--.

Column 28, Line 15, delete "can be node," and replace with --can be node 2--.